(12) United States Patent
Liu et al.

(10) Patent No.: US 12,266,424 B2
(45) Date of Patent: *Apr. 1, 2025

(54) MEMORY CIRCUIT AND METHOD OF OPERATING SAME

(71) Applicant: TAIWAN SEMICONDUCTOR MANUFACTURING COMPANY, LTD., Hsinchu (TW)

(72) Inventors: Yi-Ching Liu, Hsinchu (TW); Chia-En Huang, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/521,476

(22) Filed: Nov. 28, 2023

(65) Prior Publication Data

US 2024/0096386 A1 Mar. 21, 2024

Related U.S. Application Data

(60) Continuation of application No. 17/815,121, filed on Jul. 26, 2022, now Pat. No. 11,854,663, which is a division of application No. 17/154,514, filed on Jan. 21, 2021, now Pat. No. 11,521,663.

(60) Provisional application No. 63/057,069, filed on Jul. 27, 2020.

(51) Int. Cl.
*G11C 16/10* (2006.01)
*G11C 8/08* (2006.01)
*G11C 8/10* (2006.01)

(52) U.S. Cl.
CPC . *G11C 8/08* (2013.01); *G11C 8/10* (2013.01)

(58) Field of Classification Search
CPC ......... G11C 8/08; G11C 8/10; G11C 16/0483; G11C 5/063; G11C 7/18; G11C 8/14; G11C 7/12; G11C 7/1051; G11C 7/222
See application file for complete search history.

(56) References Cited

U.S. PATENT DOCUMENTS

| | | | |
|---|---|---|---|
| 11,521,663 B2* | 12/2022 | Liu | G11C 8/10 |
| 2004/0188714 A1 | 9/2004 | Scheuerlein et al. | |
| 2007/0263423 A1 | 11/2007 | Scheuerlein et al. | |
| 2010/0195404 A1 | 8/2010 | Lee | |

(Continued)

OTHER PUBLICATIONS

Office Action dated Apr. 8, 2022 for corresponding case No. TW 11120345430. (pp. 1-6).

*Primary Examiner* — Hien N Nguyen
(74) *Attorney, Agent, or Firm* — Hauptman Ham, LLP

(57) ABSTRACT

A memory circuit includes a first memory cell on a first layer, a second memory cell on a second layer different from the first layer, a first select transistor on a third layer different from the first layer and the second layer, and a first bit line extending in a first direction, and being coupled to the first memory cell and the second memory cell. The memory circuit further includes a first source line extending in the first direction, being coupled to the first memory cell, the second memory cell and the first select transistor, and being separated from the first bit line in a second direction different from the first direction. memory circuit includes a second source line extending in the first direction, and being coupled to the first select transistor.

20 Claims, 16 Drawing Sheets

(56) References Cited

U.S. PATENT DOCUMENTS

| | | | |
|---|---|---|---|
| 2017/0092355 A1 | 3/2017 | Kurotsuchi et al. | |
| 2017/0236568 A1* | 8/2017 | Rho | G11C 7/08 |
| | | | 711/105 |
| 2019/0198513 A1* | 6/2019 | Park | H10B 43/35 |
| 2019/0319044 A1 | 10/2019 | Harari | |
| 2021/0091108 A1 | 3/2021 | Naruke et al. | |
| 2022/0028439 A1* | 1/2022 | Liu | G11C 8/08 |
| 2022/0139430 A1 | 5/2022 | Chang et al. | |
| 2022/0165312 A1 | 5/2022 | Yu et al. | |
| 2022/0358976 A1 | 11/2022 | Chang et al. | |

* cited by examiner

MEMORY CIRCUIT AND METHOD OF OPERATING SAME

PRIORITY CLAIM

The present application is a continuation of U.S. application Ser. No. 17/815,121, filed Jul. 26, 2022, now U.S. Pat. No. 11,854,663, issued Dec. 26, 2023, which is a divisional of U.S. application Ser. No. 17/154,514, filed Jan. 21, 2021, now U.S. Pat. No. 11,521,663, issued Dec. 6, 2022, which claims the benefit of U.S. Provisional Application No. 63/057,069, filed Jul. 27, 2020, which are herein incorporated by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
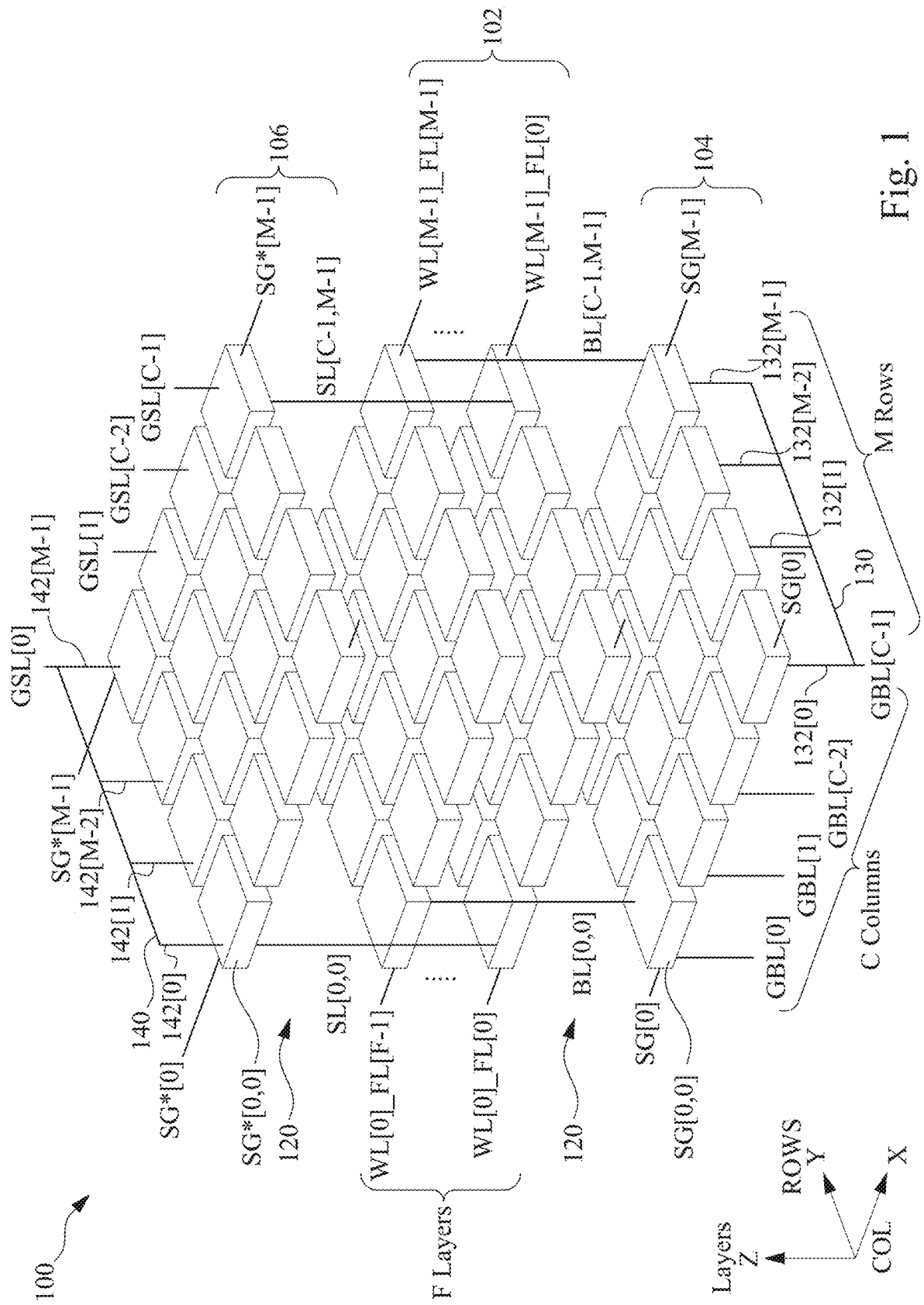
FIG. 1 is a perspective view of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a first memory cell on a first layer, a second memory cell on a second layer, a first select transistor on a third layer, a second select transistor on a fourth layer, a local bit line, a global bit line, a local source line and a global source line.

In some embodiments, the local bit line is coupled to the first memory cell, the second memory cell and the first select transistor. In some embodiments, the global bit line is coupled to the first select transistor.

In some embodiments, the local source line is coupled to the first memory cell, the second memory cell and the second select transistor. In some embodiments, the global source line is coupled to the second select transistor.

In some embodiments, the global bit line is coupled to the local bit line, the first memory cell and the second memory cell by the first select transistor. In some embodiments, the global source line is coupled to the local source line, the first memory cell and the second memory cell by the second select transistor.

In some embodiments, the first and second select transistors are enabled for a read operation, and other select transistors in other rows of the memory circuit are disabled for the read operation.

In some embodiments, by enabling the first and second select transistor for the read operation, and by disabling other select transistors in other rows of the memory circuit for the read operation, the local bit line/source line loading of the disabled select transistors is reduced compared to other approaches. In some embodiments, by reducing the local bit line/source line loading, the total bit line/source line loading and capacitance of memory circuit is reduced thereby causing the pre-charge and sensing speed of memory circuit to improve compared to other approaches.

Memory Circuit

FIG. 1 is a perspective view of a memory circuit 100, in accordance with some embodiments. In the embodiment of FIG. 1, memory circuit 100 is a memory macro.

Memory circuit 100 includes a memory cell array 102, a select gate array 104 and a select gate array 106.

Memory cell array 102 is connected to select gate array 104 and select gate array 106. Memory cell array 102 is above select gate array 104. Select gate array 106 is above memory cell array 102. Memory cell array 102 is separated from select gate array 104 and select gate array 106 by insulating region 120. In some embodiments, select gate array 104 is on a first layer of memory circuit 100. In some embodiments, memory cell array 102 is on a second layer of memory circuit 100 above the first layer. In some embodiments, memory cell array 102 is on a third layer of memory circuit 100 above the first layer and the second layer.

Each memory cell in the memory cell array 102 is electrically connected to a corresponding select gate of the select gate array 104 and a corresponding select gate of the select gate array 106.

Memory cell array 102 comprises a three dimensional (3D) array of memory cells having M rows and C columns, and arranged on F layers of memory circuit 100, where M, C and F are positive integers.

The columns C of memory cells (collectively referred to as "memory cells MC") in memory cell array 102 are arranged in a first direction Y. The rows M of memory cells MC in memory cell array 102 are arranged in a second direction X. The layers F of memory cells MC in memory cell array 102 are arranged in a third direction Z.

At least one of the first direction Y, the second direction X or the third direction Z is different from another of at least the first direction Y, the second direction X or the third direction Z. In some embodiments, at least one of the first direction Y, the second direction X or the third direction Z is perpendicular to another of at least the first direction Y, the second direction X or the third direction Z.

Memory cell array 102 comprises memory cell arrays 102[0], . . . , 102[F−1] arranged on a corresponding layer 0, . . . , F−1 of layers F of memory cell array 102. For example, each memory cell array 102[0], . . . , 102[F−1] includes an array of memory cells MC arranged on a corresponding layer 0, . . . , F−1 of layers F. Memory cell arrays 102 herein are denoted by 102[layer or floor number].

Each memory cell array 102[0], . . . , 102[F−1] of memory cell array 102 is separated from another memory cell array 102[0], . . . , 102[F−1] of memory cell array 102 in the third direction Z by insulating region 120.

Each memory cell array 102[0], . . . , 102[F−1] of memory cell array 102 includes an array of memory cells MC[0, 0, layer], MC[1, 0, layer], . . . , MC[C−1, 0, layer], . . . , MC[0, M−1, layer], MC[1, M−1, layer], . . . , MC[C−1, M−1, layer] having M rows, and C columns on a corresponding layer 0, . . . , F−1 of layers F. Memory cells MC herein are denoted by MC[column number, row number, layer or floor number]. For example, memory cell array 102[0] includes an array of memory cells MC[0, 0, 0], MC[1, 0, 0], . . . , MC[C−1, 0, 0], . . . , MC[0, M−1, 0], MC[1, M−1, 0], . . . , MC[C−1, M−1, 0] on corresponding layer 0.

The rows of memory cells MC in each memory cell array 102[0], . . . , 102[F−1] are arranged in the second direction X. The columns of cells in each memory cell array 102[0], . . . , 102[F−1] are arranged in the first direction Y. In some embodiments, each memory cell MC in memory cell array 102 is configured to store a corresponding bit of data.

In some embodiments, at least one memory cell array 102[0], . . . , 102[F−1] of memory cell array 102 is the same as at least another memory cell array 102[0], . . . , 102[F−1] of memory cell array 102. In some embodiments, at least one memory cell array 102[0], . . . , 102[F−1] of memory cell array 102 is different from at least another memory cell array 102[0], . . . , 102[F−1] of memory cell array 102.

In some embodiments, memory cell array 102 is a non-volatile random-access memory (NVRAM) array. In some embodiments, each memory cell in memory cell array 102 corresponds to a thin film transistor (TFT). In some embodiments, each memory cell in memory cell array 102 corresponds to a ferroelectric resistive random-access memory (FeRAM) cell. In some embodiments, each memory cell in memory cell array 102 corresponds to a ferroelectric field effect transistor (FeFET) memory cell. In some embodiments, each memory cell in memory cell array 102 corresponds to a magneto-resistive random-access memory (MRAM) cell. In some embodiments, each memory cell in memory cell array 102 corresponds to a resistive random-access memory (RRAM) cell. Different types of memory cells in memory cell array 102 are within the contemplated scope of the present disclosure. For example, in some embodiments, each memory cell in memory cell array 102 is a static random access memory (SRAM). In some embodiments, each memory cell in memory cell array 102 corresponds to a dynamic random access memory (DRAM) cell. In some embodiments, each memory cell in memory cell array 102 corresponds to a phase change memory cell. In some embodiments, each memory cell in memory cell array 102 corresponds to a charge-based memory cell. Other configurations of memory cell array 102 are within the scope of the present disclosure.

Each memory cell array in each corresponding layer of memory cell array 102 further includes M word lines (collectively referred to as "word lines WL") extending in the second direction X. Word lines WL herein are denoted by WL[row number]_FL[floor number]. Within each layer of memory cell array 102, M word lines are coupled to a corresponding row of memory cells of memory cell array 102[0], . . . , 102[F−1]. For example, memory cell array 102[0] further includes M word lines WL[0]_FL[0], WL[1]_FL[0] . . . , WL[M−1]_FL[0] coupled to a corresponding row of memory cells in layer 0 of memory cell array 102. Similarly, memory cell array 102[F−1] further includes M word lines WL[0]_FL[F−1], WL[1]_FL[F−1] . . . , WL[M−1]_FL[F−1] coupled to a corresponding row of memory cells in layer F−1 of memory cell array 102. Memory cell array 102 has F*M word lines WL.

Each row of memory cells in memory cell array 102[0] is associated with a corresponding word line of word lines WL[0]_FL[0], WL[1]_FL[0] . . . , WL[M−1]_FL[0] in layer 0 of memory cell array 102. Similarly, each row of memory cells in memory cell array 102[F−1] is associated with a corresponding word line of word lines WL[0]_FL[F−1], WL[1]_FL[F−1] . . . , WL[M−1]_FL[F−1] in layer F−1 of memory cell array 102. Other configurations of word lines WL are within the scope of the present disclosure.

Memory cell array 102 further includes bit lines BL[0, 0], BL[1, 0], . . . , BL[C−1, 0], . . . , BL[0, M−1], BL[1, M−1], . . . , BL[C−1, M−1] (collectively referred to as "bit lines BL") coupled to a corresponding column and a corresponding row of memory cells in memory cell array 102. Bit lines BL herein are denoted by BL[column number, row number]. For ease of illustration, some of the bit lines in memory cell array 102 are not shown in FIG. 1. Memory cell array 102 has C*M bit lines BL. In some embodiments, bit lines BL are also referred to as local bit lines.

Each column and each row in memory cell array 102 is associated with a corresponding bit line. Each bit line BL extends in the third direction Z.

Bit lines BL electrically couple corresponding memory cells located on different layers of memory cell array 102 to each other and to a corresponding select gate of select gate array 104. For example, each memory cell in row 0 and column 0 of memory cell array 102 is electrically coupled together by bit line BL[0, 0], and are further coupled to corresponding select gate SG[0, 0] of select gate array 104. Similarly, each memory cell in row M−1 and column C−1 of memory cell array 102 is electrically coupled together by bit line BL[C−1, M−1], and are further coupled to corresponding select gate SG[C−1, M−1] of select gate array 104. Other configurations of bit lines BL are within the scope of the present disclosure.

Memory cell array 102 further includes source lines SL[0, 0], SL[1, 0], . . . , SL[C−1, 0], . . . , SL[0, M−1], SL[1, M−1], . . . , SL[C−1, M−1] (collectively referred to as "source lines SL") coupled to a corresponding column and a corresponding row of memory cells in memory cell array 102. Source lines SL herein are denoted by SL[column number, row number]. For ease of illustration, some of the source lines in memory cell array 102 are not shown in FIG. 1. Memory cell array 102 has C*M source lines SL. In some embodiments, source lines SL are also referred to as local source lines.

Each column and each row in memory cell array 102 is associated with a corresponding source line. Each source line SL extends in the third direction Z.

Source lines SL electrically couple corresponding memory cells located on different layers of memory cell array 102 to each other and to a corresponding select gate of select gate array 106. For example, each memory cell in row 0 and column 0 of memory cell array 102 is electrically coupled together by source line SL[0, 0], and are further coupled to corresponding select gate SG*[0, 0] of select gate array 106. Similarly, each memory cell in row M−1 and column C−1 of memory cell array 102 is electrically coupled together by source line SL[C−1, M−1], and are further coupled to corresponding select gate SG*[C−1, M−1] of select gate array 106. Other configurations of source lines SL are within the scope of the present disclosure.

Select gate array 104 comprises an array of select gates SG[0,0], SG[1, 0], . . . , SG[C−1, 0], . . . , SG[0, M−1], SG[1, M−1], . . . , SG[C−1, M−1] (collectively referred to as "select gates SG") having M rows and C columns, where M and C are positive integers. Select gates SG herein are denoted by SG[column number, row number].

The columns C of select gates SG in select gate array 104 are arranged in the first direction Y. The rows M of select gates SG in select gate array 104 are arranged in the second direction X. In some embodiments, select gate array 104 is arranged on the first layer of memory circuit 100. For ease of illustration, some of the select gates in select gate array 104 are not labelled in FIG. 1. Select gate array 104 has C*M select gates SG.

In some embodiments, each select gate SG in select gate array 104 is similar to a corresponding memory cell in memory cell array 102, and similar detailed description is omitted. In some embodiments, each select gate SG includes a select transistor. In some embodiments, each select gate SG includes an n-type transistor, a p-type transistor or a transmission gate.

Each select gate SG in select gate array 104 is electrically coupled to corresponding memory cells MC located on different layers of memory cell array 102 by corresponding bit lines BL. For example, select gate SG[0, 0] of select gate array 104 is electrically coupled to each memory cell MC in row 0 and column 0 of memory cell array 102 by bit line BL[0, 0]. For example, select gate SG[C−1, M−1] of select gate array 104 is electrically coupled to each memory cell MC in row M−1 and column C−1 of memory cell array 102 by bit line BL[C−1, M−1].

Select gate array 104 further includes M select lines SG[0], SG[1], . . . , SG[M−1] (collectively referred to as "select line SGL") coupled to a corresponding row of select gates in select gate array 104. Select lines SGL herein are denoted by SG[row number].

Each row in select gate array 104 is associated with a corresponding select line. Each select line is configured to control the corresponding row of select gates in select gate array 104. Each select line SGL extends in the second direction X. For ease of illustration, some of the select lines in select gate array 104 are not labelled in FIG. 1. Select gate array 104 has M select lines SGL.

In some embodiments, each select line in select gate array 104 is similar to a corresponding word line WL in memory cell array 102, and similar detailed description is omitted. Other configurations of select gate array 104 or select lines SGL are within the scope of the present disclosure.

Select gate array 106 comprises an array of select gates SG*[0,0], SG*[1, 0], . . . , SG*[C−1, 0], . . . , SG*[0, M−1], SG*[1, M−1], . . . , SG*[C−1, M−1] (collectively referred to as "select gates SG*") having M rows and C columns. Select gates SG* herein are denoted by SG*[column number, row number].

The columns C of select gates SG* in select gate array 106 are arranged in the first direction Y. The rows M of select gates SG* in select gate array 106 are arranged in the second direction X. In some embodiments, select gate array 106 is arranged on the third layer of memory circuit 100. For ease of illustration, some of the select gates in select gate array 106 are not labelled in FIG. 1. Select gate array 106 has C*M select gates SG*.

In some embodiments, each select gate SG* in select gate array 106 is similar to a corresponding memory cell in memory cell array 102 or a corresponding select gate in select gate array 104, and similar detailed description is omitted. In some embodiments, each select gate SG* includes a select transistor. In some embodiments, each select gate SG* includes an n-type transistor, a p-type transistor or a transmission gate.

Each select gate SG* in select gate array 106 is electrically coupled to corresponding memory cells MC located on different layers of memory cell array 102 by corresponding source lines SL. For example, select gate SG*[0, 0] of select gate array 106 is electrically coupled to each memory cell MC in row 0 and column 0 of memory cell array 102 by source line SL[0, 0]. For example, select gate SG*[C−1, M−1] of select gate array 106 is electrically coupled to each memory cell MC in row M−1 and column C−1 of memory cell array 102 by source line SL[C−1, M−1].

Select gate array 106 further includes M select lines SG*[0], SG*[1], . . . , SG*[M−1] (collectively referred to as "select line SGL*") coupled to a corresponding row of select gates in select gate array 106. Select lines SGL* herein are denoted by SG*[row number].

Each row in select gate array 106 is associated with a corresponding select line. Each select line is configured to control the corresponding row of select gates in select gate array 106. Each select line SGL* extends in the second direction X. For ease of illustration, some of the select lines in select gate array 106 are not labelled in FIG. 1. Select gate array 106 has M select lines SGL*.

In some embodiments, each select line SGL* in select gate array 106 is similar to a corresponding word line WL in memory cell array 102 or a corresponding select line SGL, and similar detailed description is omitted. Other configurations of select gate array 106 or select lines SGL* are within the scope of the present disclosure.

Memory cell array 102 further includes C global bit lines GBL[0], GBL[1], . . . , GBL[C−1] (collectively referred to as "global bit lines GBL") coupled to a corresponding column of select gates in select gate array 104. Global bit lines GBL herein are denoted by GBL[column number]. Each column in select gate array 104 is associated with a corresponding global bit line.

Global bit line GBL[0] is electrically coupled to column 0 of select gates of select gate array 104. Stated differently, rows 0 through M−1 of select gate array 104 in column 0 of select gate array 104 are coupled together by global bit line GBL[0].

Similarly, global bit line GBL[C−1] is electrically coupled to column C−1 of select gates of select gate array 104. Stated differently, rows 0 through M−1 of select gate array 104 in column C−1 of select gate array 104 are coupled together by global bit line GBL[C−1].

Each column of select gates of select gate array 104 is configured to selectively couple the corresponding global bit line and the corresponding column of local bit lines. For example, column 0 of select gates SG[0, 0], SG[1,0], . . . , SG[C−1,0] of select gate array 104 is configured to selectively couple the corresponding global bit line GBL[0] and the corresponding column of local bit lines BL[0,0], BL[0,1], . . . , BL[0,M−1].

Similarly, column C−1 of select gates SG[C−1,0], SG[C−1,1], . . . , SG[C−1,M−1] of select gate array 104 is configured to selectively couple between the corresponding global bit line GBL[C−1] and the corresponding column of local bit lines BL[C−1,0], BL[C−1,1], . . . , BL[C−1,M−1].

Each global bit line GBL includes a conductive portion 130 that extends in at least the first direction Y, and M conductive portions 132[0], 132[1], . . . , 132[M−1] that extend in the third direction Z, and are coupled to corresponding select gates of select gate array 104 and the conductive portion 130. For example, global bit line GBL[C−1] includes a conductive portion 130 that extends in at least the first direction Y, and conductive portions 132[0], 132[1], . . . , 132[M−1] (hereinafter referred to as a "set of conductive portions 132") that extend in the third direction Z, are coupled to corresponding select gates SG[C−1,0], SG[C−1,1], . . . , SG[C−1,M−1] of select gate array 104 and conductive portion 130. For ease of illustration, some of the conductive portions 130 and conductive portions 132[0], 132[1], . . . , 132[M−1] in global bit lines GBL are not shown in FIG. 1.

Other configurations of at least global bit line GBL, conductive portion 130 or set of conductive portions 132 are within the scope of the present disclosure.

Memory cell array 102 further includes C global source lines GSL[0], GSL[1], . . . , GSL[C−1] (collectively referred to as "global source lines GSL") coupled to a corresponding column of select gates in select gate array 106. Global source lines GSL herein are denoted by GSL[column number]. Each column in select gate array 106 is associated with a corresponding global source line.

Global source line GSL[0] is electrically coupled to column 0 of select gates of select gate array 106. Stated differently, rows 0 through M−1 of select gate array 106 in column 0 of select gate array 106 are coupled together by global source line GSL[0].

Similarly, global source line GSL[C−1] is electrically coupled to column C−1 of select gates of select gate array 106. Stated differently, rows 0 through M−1 of select gate array 106 in column C−1 of select gate array 106 are coupled together by global source line GSL[C−1].

Each column of select gates of select gate array 106 is configured to selectively couple the corresponding global source line and the corresponding column of local source lines. For example, column 0 of select gates SG[0, 0], SG[1,0], . . . , SG[C−1,0] of select gate array 106 is configured to selectively couple the corresponding global source line GSL[0] and the corresponding column of local source lines SL[0,0], SL[0,1], . . . , SL[0,M−1].

Similarly, column C−1 of select gates SG[C−1,0], SG[C−1,1], . . . , SG[C−1,M−1] of select gate array 106 is configured to selectively couple the corresponding global source line GSL[C−1] and the corresponding column of local source lines SL[C−1,0], SL[C−1,1], . . . , SL[C−1,M−1].

Each global source line GSL includes a conductive portion 140 that extends in at least the first direction Y, and M conductive portions 142[0], 142[1], . . . , 142[M−1] that extend in the third direction Z, and are coupled to corresponding select gates of select gate array 106 and the conductive portion 140. For example, global source line GSL[C−1] includes a conductive portion 140 that extends in at least the first direction Y, and conductive portions 142[0], 142[1], . . . , 142[M−1] (hereinafter referred to as a "set of conductive portions 142") that extend in the third direction Z, are coupled to corresponding select gates SG*[C−1,0], SG*[C−1,1], . . . , SG*[C−1,M−1] of select gate array 106 and conductive portion 140. For ease of illustration, some of the conductive portions 140 and conductive portions 142[0], 142[1], . . . , 142[M−1] in global source lines GSL are not shown in FIG. 1.

Other configurations of at least global source line GSL, conductive portion 140 or set of conductive portions 142 are within the scope of the present disclosure.

Other configurations of memory circuit 100 are within the scope of the present disclosure. In some embodiments, select gate array 104 or 106 is not included in memory circuit 100. In some embodiments, select gate array 104 or 106 is between one or more layers F of memory cell array 102.

Figure 2A:
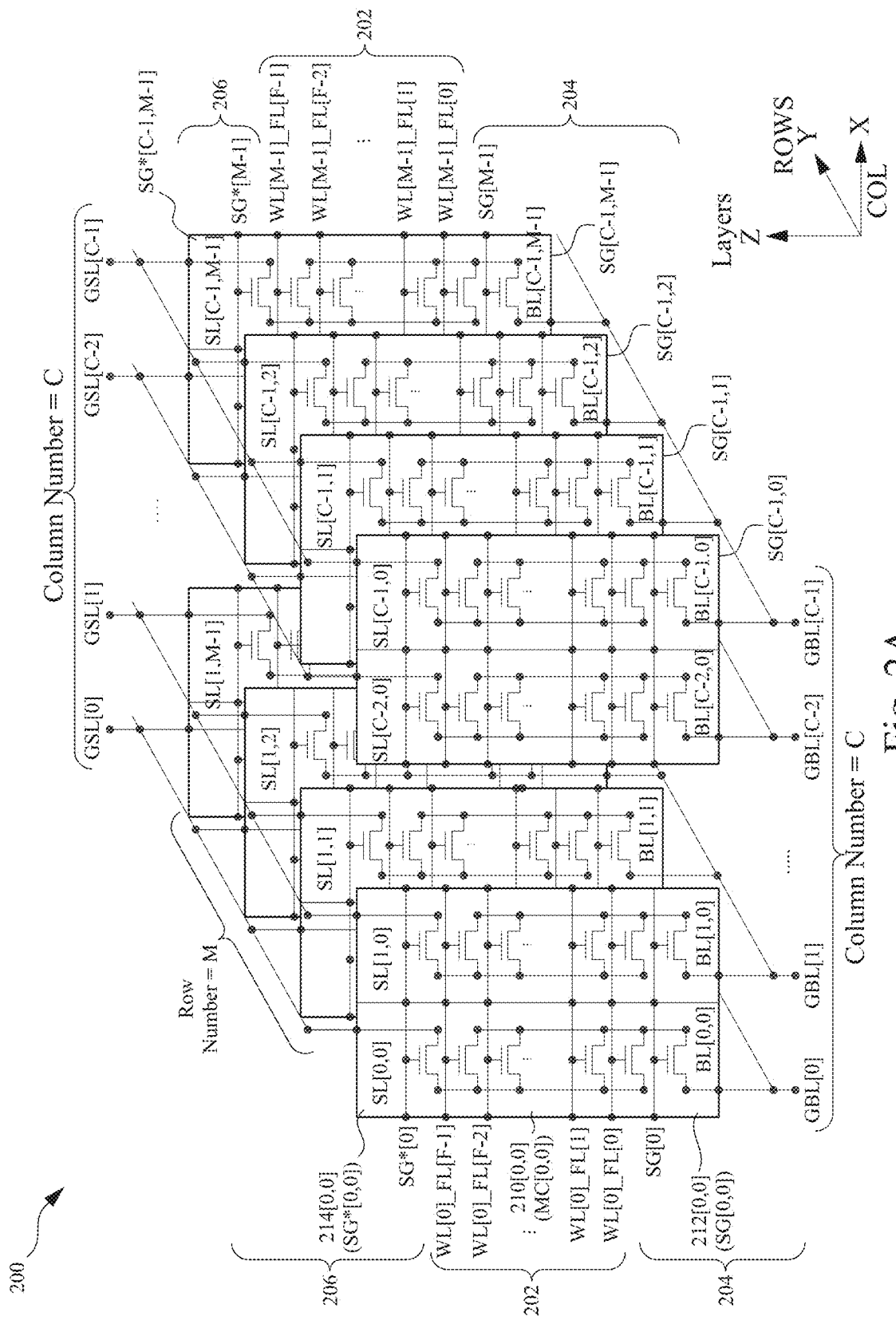
FIG. 2A is a circuit diagram of a memory circuit, in accordance with some embodiments.
Figure 2B:
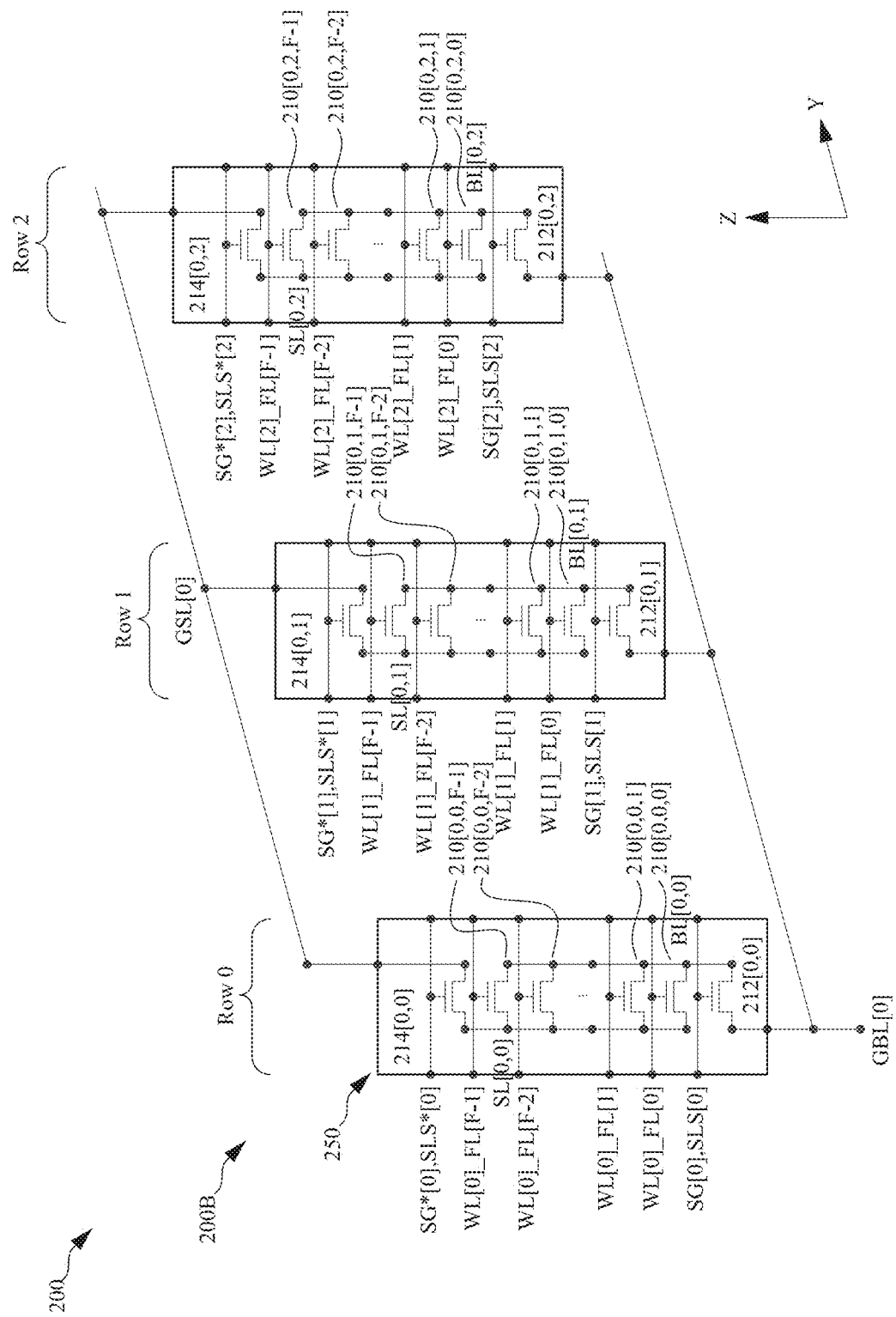
FIGS. 2B-2C are corresponding circuit diagrams of corresponding portions of the memory circuit of FIG. 2A, simplified for ease of illustration.
Figure 2C:
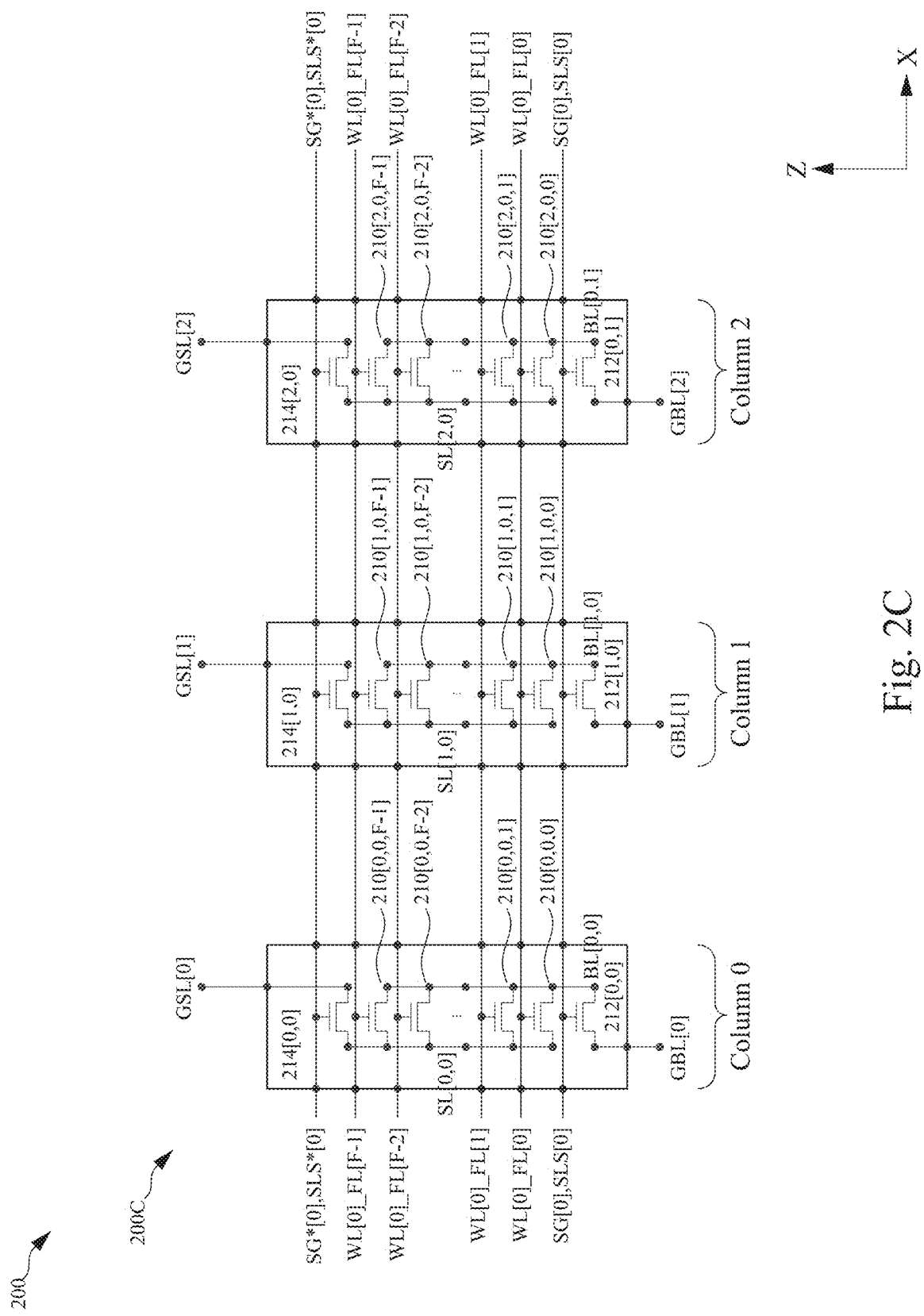

FIG. 2A is a circuit diagram of a memory circuit 200, in accordance with some embodiments. FIGS. 2B-2C are corresponding circuit diagrams of corresponding portions 200B-200C of memory circuit 200, simplified for ease of illustration. Portion 200B includes one or more features of memory circuit 200 of FIG. 2A for column 0 and rows 0-2 of memory circuit 200, and portion 200C includes one or more features of memory circuit 200 of FIG. 2A for columns 0-2 and row 0 of memory circuit 200.

Memory circuit 200 is an embodiment of memory circuit 100 of FIG. 1 expressed in a schematic diagram, and similar detailed description is therefore omitted.

Memory circuit 200 relates to memory circuit 100 of FIG. 1. Components that are the same or similar to those in one or more of FIGS. 1-10 (shown below) are given the same reference numbers, and detailed description thereof is thus omitted. For ease of illustration, some of the labeled elements of FIGS. 2A-2C are not labelled in each of FIGS.

2A-2C. In some embodiments, FIGS. 2A-2C include additional elements not shown in FIGS. 2A-2C.

Memory circuit 200 includes a memory cell array 202, a select gate array 204 and a select gate array 206.

Memory cell array 202 is an embodiment of memory cell array 102 of FIG. 1, select gate array 204 is an embodiment of select gate array 104 of FIG. 1, select gate array 206 is an embodiment of select gate array 106 of FIG. 1, and similar detailed description is therefore omitted.

Memory cell array 202 includes memory cell arrays 202[0], . . . , 202[F−1] arranged on a corresponding layer 0, . . . , F−1 of layers F of memory cell array 202. Memory cell arrays 202[0], . . . , 202[F−1] are embodiments of memory cell arrays 102[0], . . . , 102[F−1] of FIG. 1, and similar detailed description is therefore omitted.

Each memory cell array 202[0], . . . , 202[F−1] of memory cell array 202 includes an array of memory cells MC[0, 0, layer], MC[1, 0, layer], . . . , MC[C−1, 0, layer], . . . , MC[0, M−1, layer], MC[1, M−1, layer], . . . , MC[C−1, M−1, layer] having M rows, and C columns on a corresponding layer 0, . . . , F−1 of layers F.

Each memory cell MC includes a corresponding transistor (collectively referred to as "transistors 210"). Transistors 210 herein are denoted by 210[column number, row number, layer or floor number]. For example, memory cell array 202[0] includes an array of transistors 210[0, 0, 0], 210[1, 0, 0], . . . , 210[C−1, 0, 0], . . . , 210[0, M−1, 0], 210[1, M−1, 0], . . . , 210[C−1, M−1, 0] on corresponding layer 0. For ease of illustration, some transistors 210 of memory cell array 202 are not labelled in FIG. 2A.

Each of transistors 210 are n-type transistors. In some embodiments, each of transistors 210 are N-type Metal Oxide Semiconductor (NMOS) transistors. Other transistor types are within the scope of the present disclosure. In some embodiments, each of transistors 210 are p-type transistors. In some embodiments, each of transistors 210 are P-type Metal Oxide Semiconductor (PMOS) transistors.

Each transistor 210 includes a gate coupled to a corresponding word line WL, a source coupled to at least a corresponding source line SL and a drain coupled to at least a corresponding bit line BL. Other transistor terminals are within the scope of the present disclosure. For example, reference to the drains and sources of a same transistor in the present disclosure can be changed to a source and a drain of the same transistor.

For each layer of memory cell array 202, each transistor 210 has a gate coupled to a word line within the corresponding layer. For example, in layer 0, each transistor 210 has a corresponding gate coupled to a word line within layer 0. Stated differently, word lines WL[0]_FL[0], WL[1]_FL[0] . . . , WL[M−1]_FL[0] are coupled to a corresponding row of transistors (e.g., memory cells) in layer 0 of memory cell array 102 by each gate of the corresponding transistor. Each gate is configured to receive a corresponding word line signal (not labelled) on the corresponding word line WL.

A pillar includes memory cells in each layer of memory cell array 202 within a specific row and a specific column, a select gate of select gate array 204 within the same specific row and same specific column, and a select gate of select gate array 206 within the same specific row and same specific column. For example, a pillar 250 (FIG. 2B) in row 0 and column 0 of memory circuit 200 corresponds to memory cells 210[0,0,0], 210[0,0,1], . . . , 210[0,0,F−1] in row 0 and column 0 of each layer of memory cell array 202, select transistor 212[0,0] in row 0 and column 0, and select transistor 214[0,0] in row 0 and column 0.

Within each pillar, a drain of each corresponding memory cell on each layer of memory cell array 202 is coupled together by a local bit line in the pillar, and is further coupled to a corresponding drain/source of a select gate of select gate array 204 in the pillar. For example, a drain of corresponding memory cells 210[0,0,0], 210[0,0,1], . . . , 210[0,0,F−1] in row 0 and column 0 of each layer of memory cell array 202 are coupled together by bit line BL[0,0], and are further coupled to a drain/source of select transistor 212[0,0] in pillar 250 (FIG. 2B).

Within each pillar, a source of each corresponding memory cell on each layer of memory cell array 202 is coupled together by a local source line in the pillar, and is further coupled to a corresponding drain/source of a select gate of select gate array 204 in the pillar. For example, a source of corresponding memory cells 210[0,0,0], 210[0,0,1], . . . , 210[0,0,F−1] in row 0 and column 0 of each layer of memory cell array 202 are coupled together by source line SL[0,0], and are further coupled to a drain/source of select transistor 214[0,0] in pillar 250 (FIG. 2B).

Select gate array 204 includes array of select gates SG[0, 0], SG[1, 0], . . . , SG[C−1, 0], . . . , SG[0, M−1], SG[1, M−1], . . . , SG[C−1, M−1], described in FIG. 1.

Each select gate SG[0,0], SG[1, 0], . . . , SG[C−1, 0], . . . , SG[0, M−1], SG[1, M−1], . . . , SG[C−1, M−1] of select gate array 204 includes a corresponding select transistor 212[0,0], 212[1, 0], . . . , 212[C−1, 0], . . . , 212[0, M−1], 212[1, M−1], . . . , 212[C−1, M−1] (collectively referred to as "select transistors 212"). Select transistors 212 herein are denoted by 212[column number, row number]. For ease of illustration, some select transistors 212 of memory circuit 200 are not labelled in FIG. 2A.

Each column of select transistors 212 is configured to selectively couple the corresponding global bit line and the corresponding column of local bit lines together. For example, column 0 of select transistors 212[0, 0], 212[0,1], . . . , 212[0,M−1] is configured to selectively couple the corresponding global bit line GBL[0] and the corresponding column of local bit lines BL[0,0], BL[0,1], . . . , BL[0,M−1].

Each of select transistors 212 are n-type transistors. In some embodiments, each of select transistors 212 are NMOS transistors. Other transistor types are within the scope of the present disclosure. In some embodiments, each of select transistors 212 are p-type transistors. In some embodiments, each of select transistors 212 are PMOS transistors.

Each select transistor 212 includes a gate coupled to a corresponding select line SGL, a drain/source coupled to at least a corresponding global bit line GBL and a source/drain coupled to at least a corresponding bit line BL.

Each gate of a corresponding row of select transistors 212 is electrically coupled to a corresponding select line SG[0], SG[1], . . . , SG[M−1], and is configured to receive a corresponding select line signal SLS[0], SLS[1], . . . , SLS[M−1]. Each select transistor of select transistors 212 is enabled or disabled in response to the corresponding select line signal SLS[0], SLS[1], . . . , SLS[M−1] received on the corresponding select line SG[0], SG[1], . . . , SG[M−1].

If enabled, a select transistor of select transistors 212 electrically couples the corresponding global bit line and the corresponding column of local bit lines. If disabled, the select transistor of select transistors 212 electrically decouples the corresponding global bit line and the corresponding column of local bit lines. In some embodiments, one row of select transistors 212 is enabled for a duration of time (between time T1-T2 in FIG. 3C), and the other rows of select transistors 212 are disabled for the same duration of time (between time T1-T2 in FIG. 3C).

Within each pillar, a drain/source of each corresponding select transistor 212 is coupled to a corresponding global bit line GBL in the pillar. For example, a drain/source of corresponding select transistor 212[0,0] in row 0 and column 0 is coupled to global bit line GBL[0] in pillar 250 (FIGS. 2B-2C).

Within each column, a global bit line GBL is electrically coupled to each drain/source of each corresponding select transistor 212 within the column. For example, in column 0, global bit line GBL[0] is electrically coupled to each drain/source of select transistors 212[0,0], 212[0,1], . . . , 212[0, M−1] in column 0. Thus, each select transistor 212 within a corresponding column is configured to share the corresponding global bit line GBL.

Within each pillar, a source/drain of each corresponding select transistor 212 is coupled to a corresponding local bit line BL in the pillar. For example, a source/drain of corresponding select transistor 212[0,0] in row 0 and column 0 is coupled to local bit line BL[0,0] in pillar 250 (FIGS. 2B-2C).

Within each pillar, the source/drain of each corresponding select transistor 212 is coupled to the drains of each corresponding memory cell on each layer of memory cell array 202 in the pillar by the corresponding local bit line BL. For example, the source/drain of corresponding select transistor 212[0,0] in row 0 and column 0 is coupled to the drains of memory cells 210[0,0,0], 210[0,0,1], . . . , 210[0,0,F−1] in row 0 and column 0 of each layer of memory cell array 202 in pillar 250 by local bit line BL[0,0]. (FIGS. 2B-2C).

Select gate array 206 includes array of select gates SG*[0,0], SG*[1, 0], . . . , SG*[C−1, 0], . . . , SG*[0, M−1], SG*[1, M−1], . . . , SG*[C−1, M−1], described in FIG. 1.

Each select gate SG*[0,0], SG*[1, 0], . . . , SG*[C−1, 0], . . . , SG*[0, M−1], SG*[1, M−1], . . . , SG*[C−1, M−1] of select gate array 206 includes a corresponding select transistor 214[0,0], 214[1, 0], . . . , 214[C−1, 0], . . . , 214[0, M−1], 214[1, M−1], . . . , 214[C−1, M−1] (collectively referred to as "select transistors 214"). Select transistors 214 herein are denoted by 214[column number, row number]. For ease of illustration, some select transistors 214 of memory circuit 200 are not labelled in FIG. 2A.

Each column of select transistors 214 is configured to selectively couple the corresponding global source line and the corresponding column of local source lines together. For example, column 0 of select transistors 214[0, 0], 214[0,1], . . . , 214[0,M−1] is configured to selectively couple the corresponding global source line GSL[0] and the corresponding column of local source lines SL[0,0], SL[0,1], . . . , SL[0,M−1].

Each of select transistors 214 are n-type transistors. In some embodiments, each of select transistors 214 are NMOS transistors. Other transistor types are within the scope of the present disclosure. In some embodiments, each of select transistors 214 are p-type transistors. In some embodiments, each of select transistors 214 are PMOS transistors.

In some embodiments, at least one select transistor of select transistors 212 or 214 includes multiple transistors (e.g., multiple cells) coupled in parallel which thereby enhances the driving current capability of the corresponding select gate SG.

In some embodiments, at least one select transistor of select transistors 212 or 214 has a same transistor size as at least one transistor 210 in a corresponding memory cell of memory cell array 202 or another select transistor of select transistors 212 or 214. In some embodiments, transistor size includes one or more of a number of fins, a channel length or a channel width. In some embodiments, at least one select transistor of select transistors 212 or 214 has a different transistor size as at least one transistor 210 in a corresponding memory cell of memory cell array 202 or another select transistor of select transistors 212 or 214.

Each select transistor 214 includes a gate coupled to a corresponding select line SGL*, a drain/source coupled to at least a corresponding global source line GSL and a source/drain coupled to at least a corresponding source line SL.

Each gate of a corresponding row of select transistors 214 is electrically coupled to a corresponding select line SG*[0], SG*[1], . . . , SG*[M−1], and is configured to receive a corresponding select line signal SLS*[0], SLS*[1], . . . , SLS*[M−1]. Each select transistor of select transistors 214 is enabled or disabled in response to the corresponding select line signal SLS*[0], SLS* [1], . . . , SLS* [M−1] received on the corresponding select line SG*[0], SG*[1], . . . , SG*[M−1]. In some embodiments, at least select line signal SLS*[0], SLS*[1], . . . , SLS*[M−2] or SLS*[M−1] is equal to at least corresponding select line signal SLS[0], SLS[1], . . . , SLS[M−2] or SLS[M−1].

If enabled, a select transistor of select transistors 214 electrically couples the corresponding global source line and the corresponding column of local source lines. If disabled, the select transistor of select transistors 214 electrically decouples the corresponding global source line and the corresponding column of local source lines. In some embodiments, one row of select transistors 214 is enabled for a duration of time (between time T1-T2 in FIG. 3C), and the other rows of select transistors 214 are disabled for the same duration of time (between time T1-T2 in FIG. 3C).

In some embodiments, the timing of the enabling or disabling of select transistors 212 is synchronized with the timing of the enabling or disabling of select transistors 214.

Within each pillar, a drain/source of each corresponding select transistor 214 is coupled to a corresponding global source line GSL in the pillar. For example, a drain/source of corresponding select transistor 214[0,0] in row 0 and column 0 is coupled to global source line GSL[0] in pillar 250 (FIGS. 2B-2C).

Within each column, a global source line GSL is electrically coupled to each drain/source of each corresponding select transistor 214 within the column. For example, in column 0, global source line GSL[0] is electrically coupled to each drain/source of select transistors 214[0,0], 214[0,1], . . . , 214[0,M−1] in column 0. Thus, each select transistor 214 within a corresponding column is configured to share the corresponding global source line GSL.

Within each pillar, a source/drain of each corresponding select transistor 214 is coupled to a corresponding local source line SL in the pillar. For example, a source/drain of corresponding select transistor 214[0,0] in row 0 and column 0 is coupled to local source line SL[0,0] in pillar 250 (FIGS. 2B-2C).

Within each pillar, the source/drain of each corresponding select transistor 214 is coupled to the sources of each corresponding memory cell on each layer of memory cell array 202 in the pillar by the corresponding local source line SL. For example, the source/drain of corresponding select transistor 214[0,0] in row 0 and column 0 is coupled to the sources of memory cells 210[0,0,0], 210[0,0,1], . . . , 210[0,0,F−1] in row 0 and column 0 of each layer of memory cell array 202 in pillar 250 by local source line SL[0,0]. (FIGS. 2B-2C).

In some embodiments, by enabling one row of select transistors 214 for a duration of time, and by disabling the other rows of select transistors 214 in the same column for the same duration of time, the global source line GSL in the same column is able to be shared.

In some embodiments, by enabling one row of select transistors 212 for a duration of time, and by disabling the other rows of select transistors 212 in the same column for the same duration of time, the local bit line BL loading of the disabled select transistors 212 is reduced compared to other approaches. Similarly, in some embodiments, by enabling one row of select transistors 214 for a duration of time, and by disabling the other rows of select transistors 214 in the same column for the same duration of time, the local source line SL loading of the disabled select transistors 214 is reduced compared to other approaches. In some embodiments, by reducing the local BL/SL loading, the total BL/SL loading and capacitance of memory circuit 200 is reduced thereby causing the pre-charge and sensing speed of memory circuit 200 to improve compared to other approaches.

Figure 3A:
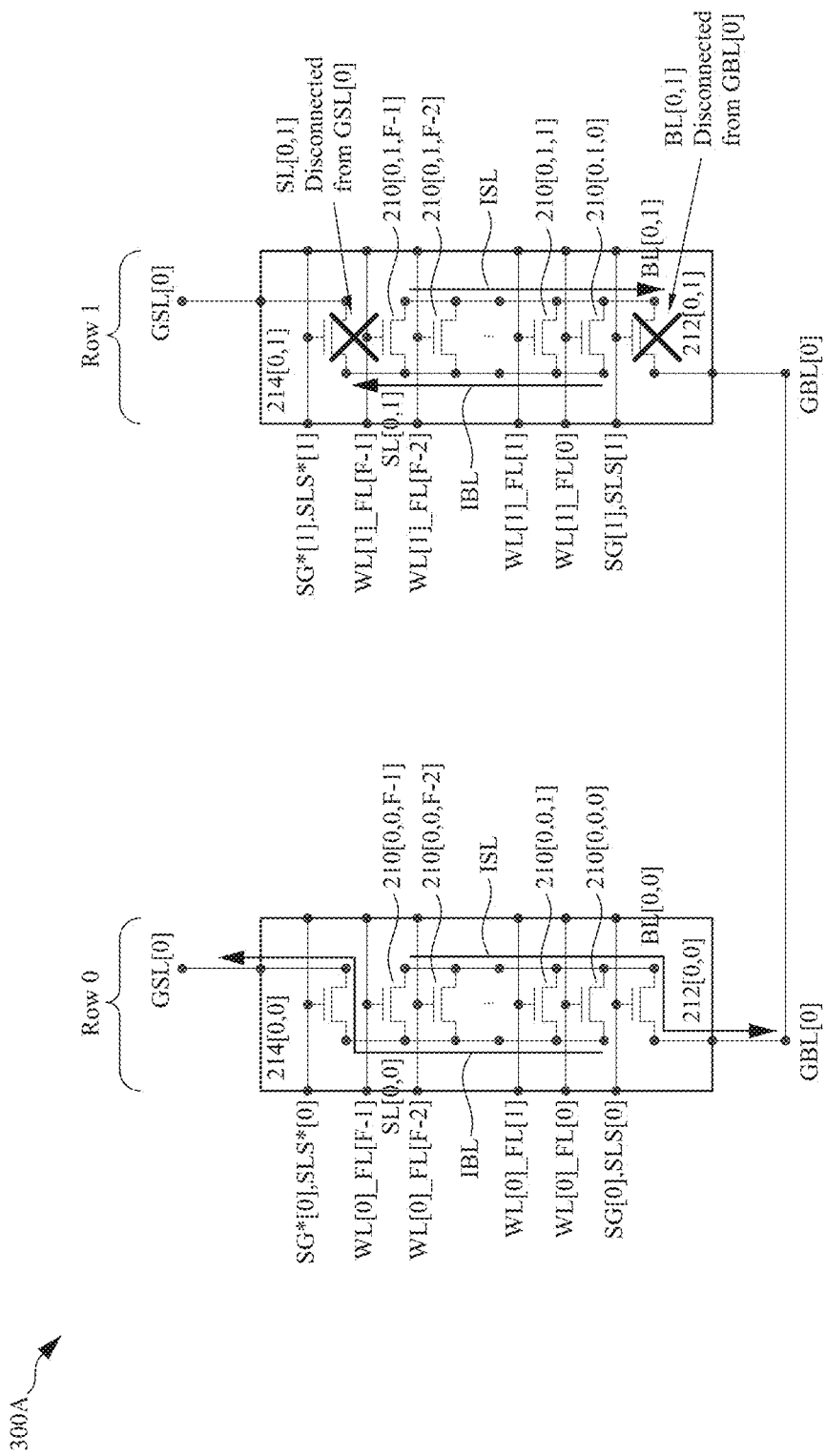
FIG. 3A is a circuit diagram of a memory circuit, in accordance with some embodiments.

FIG. 3A is a circuit diagram of a memory circuit 300A, in accordance with some embodiments.

Memory circuit 300A is a portion of memory circuit 200 of FIGS. 2A-2C. For example, memory circuit 300A corresponds to rows 0 and 1 of portion 200B of memory circuit 200 of FIG. 2B.

Figure 3B:
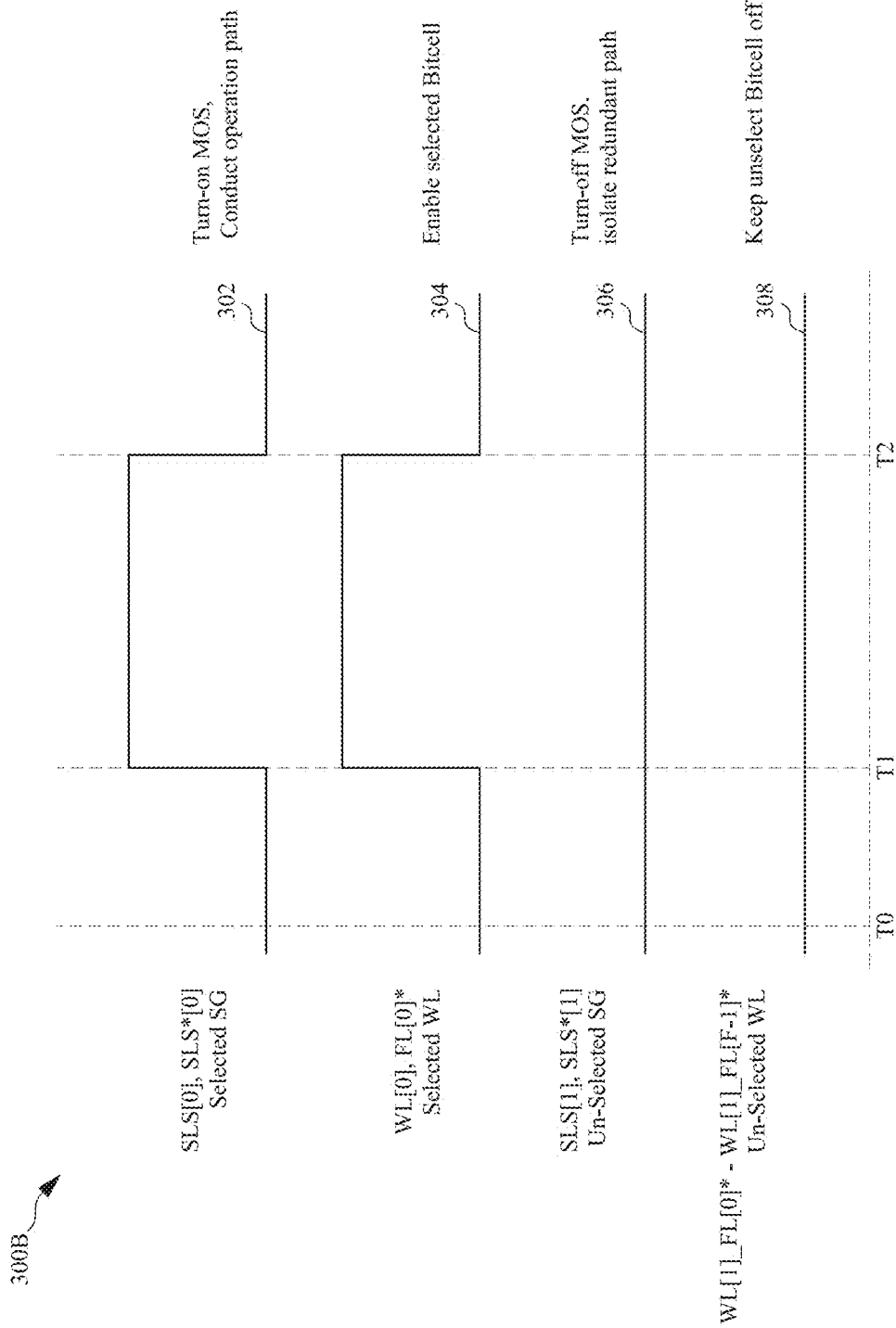
FIG. 3B is a timing diagram of waveforms of a memory circuit, in accordance with some embodiments.

FIG. 3B is a timing diagram 300B of waveforms 302, 304, 306 and 308 of a memory circuit, such as portion 300A of memory circuit 200 in FIGS. 2A-2C, in accordance with some embodiments.

Memory circuit 300A and timing diagram 300B are an example of enabling one row (e.g., row 0) of select transistors 212 and 214, and disabling the other rows (e.g., rows 1 through M−1) of select transistors 212 and 214 in the same column (column 0).

In some embodiments, FIG. 3B is a timing diagram 300B of waveforms of at least circuit 100-200 of FIGS. 1 and 2A-2C or memory circuits 400-800 in FIGS. 4-8, in accordance with some embodiments.

At time T0, each of select line signal SLS[0], select line signal SLS*[0], select line signal SLS[1], select line signal SLS*[1] thereby causing corresponding select transistor 212[0,0], 214[0,0], 212[0,1], 214[0,1] to be turned off. By select transistor 212[0,0] being turned off, bit line BL[0,0] is not coupled to global bit line GBL[0], and by select transistor 214[0,0] being turned off, source line SL[0,0] is not coupled to global source line GSL[0]. By select transistor 212[0,1] being turned off, bit line BL[0,1] is not coupled to global bit line GBL[0], and by select transistor 214[0,1] being turned off, source line SL[0,1] is not coupled to global source line GSL[0].

At time T0, each of word line signal WL[0]_FL[0]* of word line WL[0]_FL[0]*, and word line signals WL[1]_FL[0]* of word line WL[1]_FL[0]—word line signals WL[1]_FL[F−1]* of word line WL[1]_FL[F−1] are logically low.

At time T1, select line signal SLS[0] and select line signal SLS*[0] transition from logically low to logically high. In response to select line signal SLS[0] and select line signal SLS*[0] being logically high causes select transistors 212[0,0] and 214[0,0] to be enabled or turned on. By select transistor 212[0,0] being turned on, bit line BL[0,0] is coupled to global bit line GBL[0], and by select transistor 214[0,0] being turned on, source line SL[0,0] is coupled to global source line GSL[0]. Thus, a current path IBL from the bit line BL[0,0] to the global bit line GBL[0] is closed, and a current path ISL from the source line SL[0,0] to the global source line GSL[0] is closed. However, since select transistor 212[0,1] is turned off, a current path from the bit line BL[0,1] to the global bit line GBL[0] is opened, and select transistor 214[0,1] is turned off, a current path from the source line SL[0,1] to the global source line GBL[0] is opened. Thus, one row (e.g., row 0) of select transistors 212[0,0] and 214[0,0] is selected, and the other rows (e.g., rows 1 through M−1) of select transistors 212[0,1] and 214[0,1] in the same column (column 0) are not selected or disabled.

At time T1, word line signal WL[0]_FL[0]* of a selected memory cell (e.g., transistor 210[0,0,0]) also transitions from logically low to logically high. In other words, a selected memory cell MC[0,0,0] in memory cell array 202[0] is enabled and data can be read from the selected memory cell. In response to word line signal WL[0]_FL[0]* being logically high causes transistor 210[0,0,0] to be enabled or turned on. By transistor 210[0,0,0] being turned on, bit line BL[0,0] and source line SL[0,0] are together, allowing global bit line GBL[0] and global source line GSL[0] to be coupled together.

In some embodiments, one or more memory cells of other layers of memory cell array 202 within the same pillar as memory cell 210 [0,0,0] are unselected. In some embodiments, unselected memory cells of row 0 and column 0 of memory cell array 202 have corresponding logically low word line signals of corresponding word lines WL[0]_FL[1]-WL[0]_FL[F−1].

In some embodiments, memory cells in other rows of memory cell array 202 are unselected. In some embodiments, unselected memory cells in other rows of memory cell array 202 have corresponding word line signals WL[1]_FL[0]* through WL[1]_FL[F−1]* that are logically low.

At time T2, select line signal SLS[0] and select line signal SLS*[0] transition from logically high to logically low. In response to select line signal SLS[0] and select line signal SLS*[0] being logically low causes select transistors 212[0,0] and 214[0,0] to be disabled or turned off. By select transistor 212[0,0] being turned off, bit line BL[0,0] is decoupled from global bit line GBL[0], and by select transistor 214[0,0] being turned off, source line SL[0,0] is decoupled from global source line GSL[0]. Thus, the current path IBL from the bit line BL[0,0] to the global bit line GBL[0] is opened, and the current path ISL from the source line SL[0,0] to the global source line GBL[0] is opened. Thus, row 0 of select transistors 212[0,0] and 214[0,0] is deselected.

At time T2, word line signal WL[0]_FL[0]* of transistor 210[0,0,0]) transitions from logically high to logically low. In other words, selected memory cell MC[0,0,0] in memory cell array 202[0] is disabled or deselected and data can no longer be read from the unselected memory cell. In response to word line signal WL[0]_FL[0]* being logically low causes transistor 210[0,0,0] to be disabled or turned off. By transistor 210[0,0,0] being turned off, bit line BL[0,0] and source line SL[0,0] are disconnected.

Figure 4:
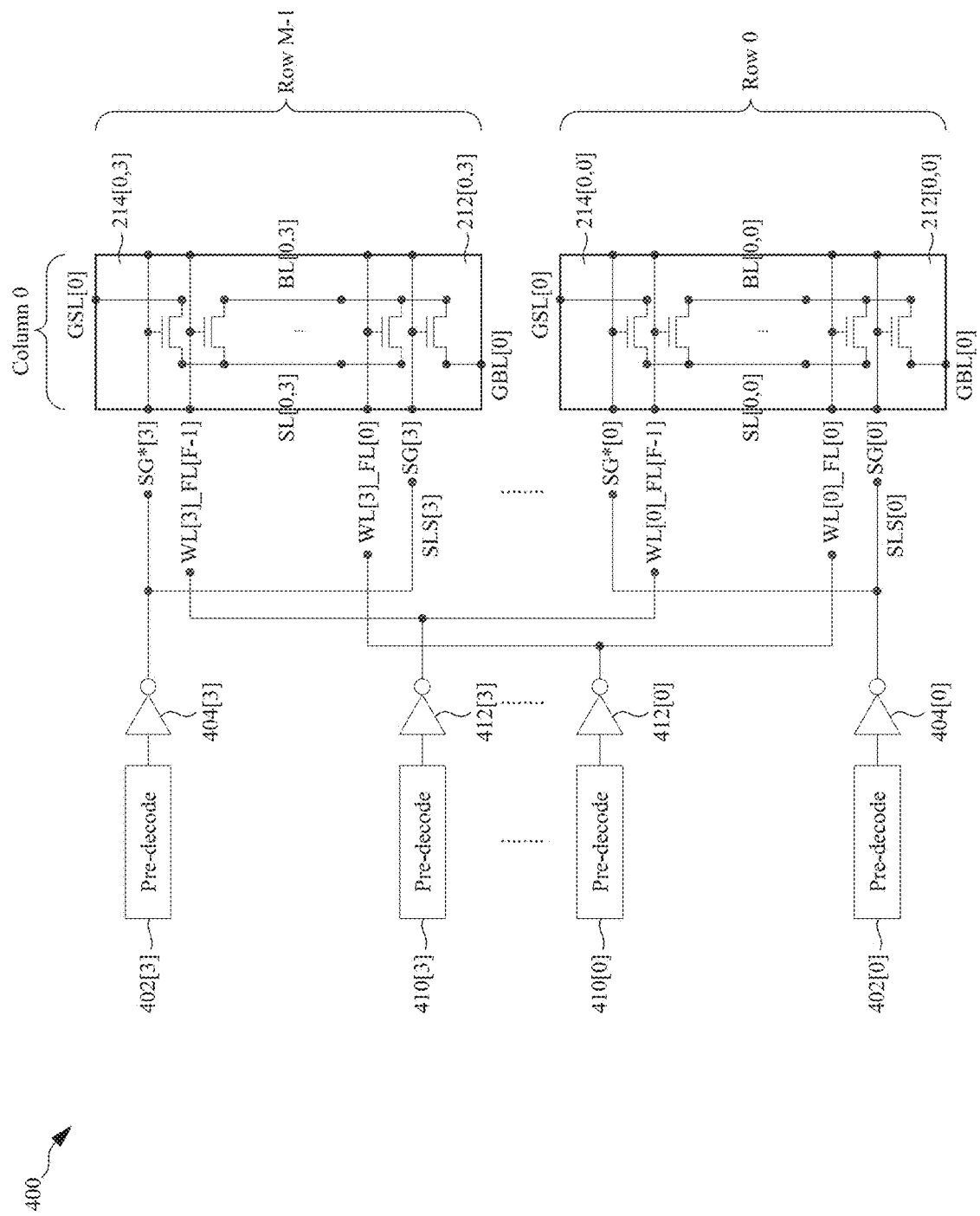
FIG. 4 is a circuit diagram of a memory circuit, in accordance with some embodiments.

FIG. 4 is a circuit diagram of a memory circuit 400, in accordance with some embodiments.

Memory circuit 400 is an embodiment of memory circuit 100 of FIG. 1 expressed in a schematic diagram, and similar detailed description is therefore omitted.

Memory circuit 400 is a variation of memory circuit 200 of FIGS. 2A-2C. Memory circuit 400 corresponds to a portion of memory circuit 200. For example, memory circuit 400 corresponds to column 0 and rows 0-3 of memory circuit 200.

In comparison with memory circuit 200, memory circuit 400 further includes pre-decoder circuits 402, select line driver circuits 404, pre-decoder circuits 410 and word line driver circuits 412.

Pre-decoder circuits 402 include pre-decoder circuits 402[0], . . . , 402[3]. In some embodiments, pre-decoder circuits 402 are configured to pre-decode portions of addresses in select gate array 204 or 206 that identify a row of select gates in select gate arrays 204 and 206. In some embodiments, the pre-decoder circuits 402 include row decoder circuits (not shown).

Select line driver circuits 404 include select line driver circuits 404[0], . . . , 404[3]. In some embodiments, select line driver circuits 404 are configured to generate select line signals SLS[0], . . . , SLS[3]. Each pre-decoder circuit 402[0], . . . , 402[3] is coupled to a corresponding select line driver circuit 404[0], . . . , 404[3].

Each select line driver circuit is coupled to a pair of select gates within each corresponding row of memory circuit 400. Each select line driver circuit 404[0], . . . , 404[3] is coupled to a corresponding select gate (e.g., select transistor 212[0,0], . . . , 212[0,3]) of select gate array 204 by a corresponding select line SG[0], . . . , SG[3] and to a corresponding select gate (e.g., select transistor 214[0,0], . . . , 214[0,3]) of select gate array 206 by a corresponding select line SG*[0], . . . , SG*[3]. In some embodiments, each select gate (e.g., select transistor 212[0,0], . . . , 212[0,3]) of select gate array 204 has a same select line signal (e.g., SLS[0], . . . , SLS[3]) as a corresponding select gate (e.g., select transistor 214[0,0], . . . , 214[0,3]) of select gate array 206 in the same row of memory circuit 400.

Pre-decoder circuits 410 include pre-decoder circuits 410[0], . . . , 410[3]. In some embodiments, pre-decoder circuits 410 are configured to pre-decode portions of addresses in memory cell array 202 that identify a row of memory cells in memory cell array 202. In some embodiments, the pre-decoder circuits 410 include row decoder circuits.

Word line driver circuits 412 include word line driver circuits 412[0], . . . , 412[3]. Each pre-decoder circuit 410[0], . . . , 410[3] is coupled to a corresponding word line driver circuit 412[0], . . . , 412[3]. In some embodiments, word line driver circuits 412 are configured to generate word line signals on corresponding word lines. For example, word line driver circuit 412[0] is configured to generate word line signals on word lines WL[0]_FL[0], . . . , WL[3]_FL[0], and word line driver circuit 412[1] is configured to generate word line signals on word lines WL[0]_FL[F−1], . . . , WL[3]_FL[F−1].

Each word line driver circuit is coupled to each word line within each corresponding row and layer of memory circuit 400. For example, word line driver circuit 412[0] is coupled to word lines WL[0]_FL[0], . . . , WL[3]_FL[0] on layer 0 of memory cell array 202. Similarly, word line driver circuit 412[3] is coupled to word lines WL[0]_FL[F−1], . . . , WL[3]_FL[F−1] on layer F−1 of memory cell array 202. Stated differently, word line driver circuits 412 are shared by each row of memory cells in the same layer of memory cell array 202.

In some embodiments, by using at least pre-decoder circuits 402, select line driver circuits 404, pre-decoder circuits 410 or word line driver circuits 412 as arranged, memory circuit includes less driver circuits (e.g., select line driver circuits 404 and word line driver circuits 412) than other approaches. In some embodiments, by reducing the number of driver circuits, memory circuit 400 occupies less area than other approaches. In some embodiments, the number of driver circuits reduced by memory circuit 400 is at least 70%.

While FIG. 4 was described with respect to 1 column (e.g., column 0) and 4 rows (e.g., rows 0-3) of memory circuit 200, the features of memory circuit 400 are applicable to each of the rows and columns of memory circuit 200, and are omitted for brevity.

Figure 5A:
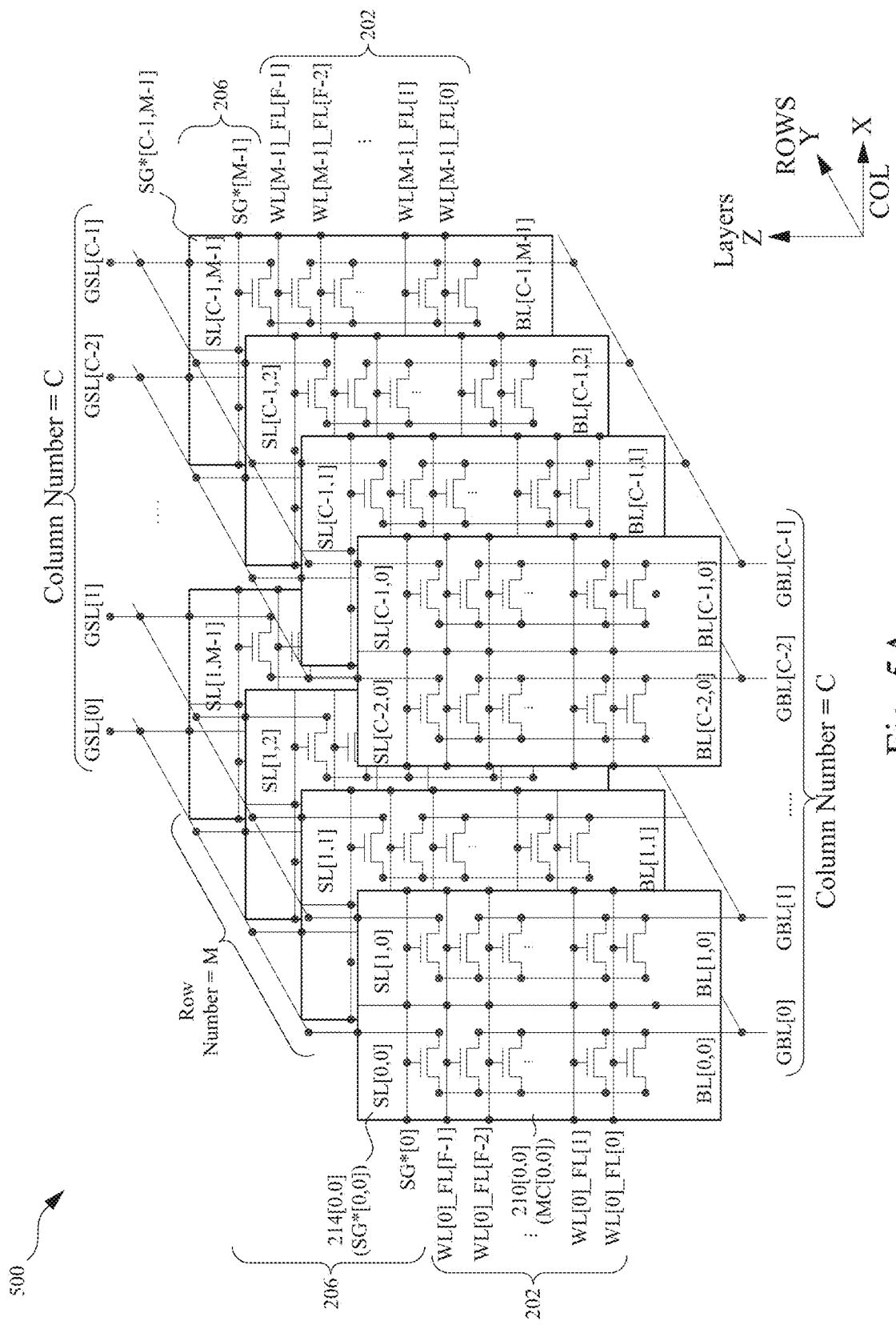
FIG. 5A is a circuit diagram of a memory circuit, in accordance with some embodiments.
Figure 5B:
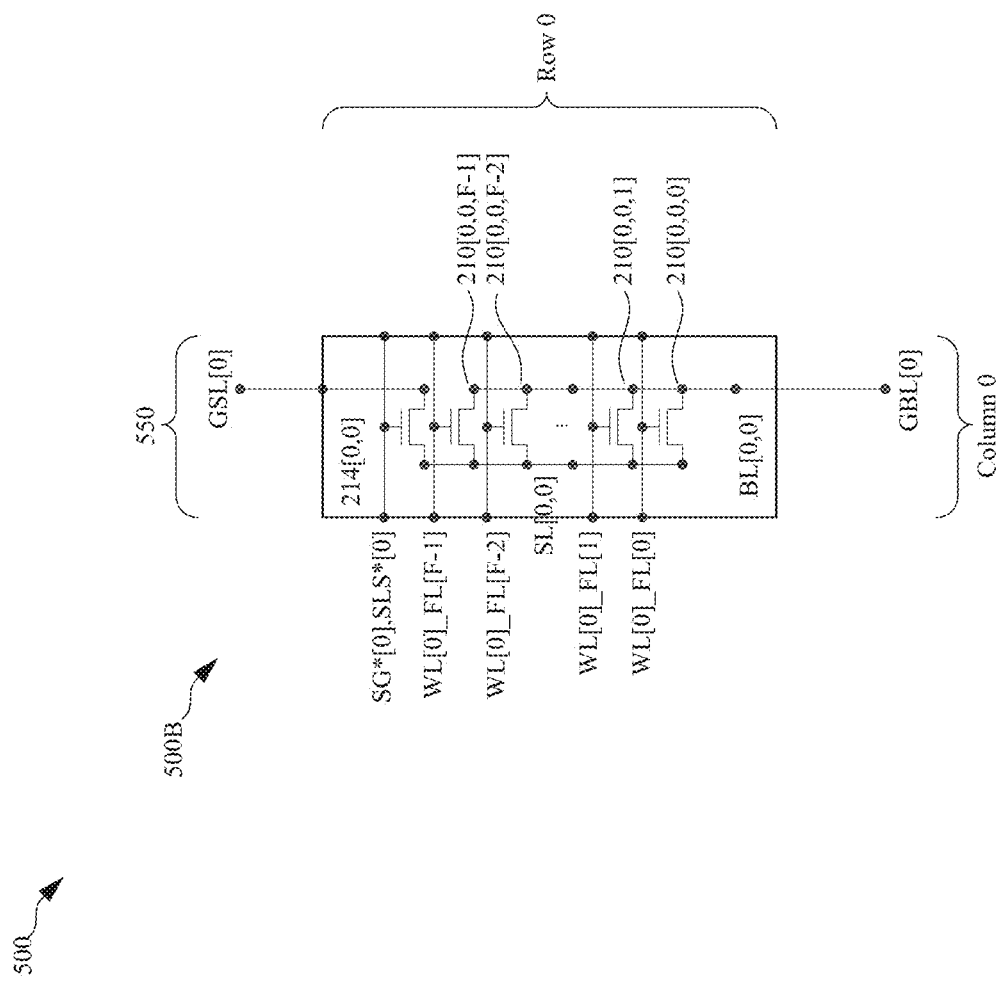
FIG. 5B is a corresponding circuit diagram of a corresponding portion of the memory circuit of FIG. 5A, simplified for ease of illustration.

FIG. 5A is a circuit diagram of a memory circuit 500, in accordance with some embodiments. FIG. 5B is a corresponding circuit diagram of a corresponding portion 500B of memory circuit 500, simplified for ease of illustration. Portion 500B includes one or more features of memory circuit 500 of FIG. 5A for column 0 and row 0 of memory circuit 500, and similar detailed description is omitted. Portion 500B corresponds to a pillar 550.

Memory circuit 500 is a variation of memory circuit 200 of FIGS. 2A-2C. For example, memory circuit 500 corresponds to memory circuit 200 without select gate array 204.

Memory circuit 500 is an embodiment of memory circuit 100 of FIG. 1 expressed in a schematic diagram, and similar detailed description is therefore omitted.

Memory circuit 500 is a variation of memory circuit 200 of FIGS. 2A-2C. In comparison with memory circuit 200 of FIGS. 2A-2C, memory circuit 500 does not include select gate array 204, select transistors 212 and select lines SG.

By not including select gate array 204, select transistors 212 and select lines SG, each column of global bit lines GBL is directly coupled to columns of local bit lines BL. For example, global bit line GBL[0] within column 0 is directly coupled to each of local bit lines BL[0,0], BL[0,1], . . . , BL[0,M−1] within column 0 of memory circuit 500.

By not including select gate array 204, select transistors 212 and select lines SG, each bit line BL within a corresponding column of memory circuit 500 are coupled together. For example, each of local bit lines BL[0,0], BL[0,1], . . . , BL[0,M−1] within column 0 of memory circuit 500 are coupled to each other by global bit line GBL[0].

Within each pillar, the drains of each corresponding memory cell on each layer of memory cell array 202 within the pillar is coupled to the corresponding global bit line GBL by the corresponding local bit line BL. For example, the drains of corresponding memory cells 210[0,0,0], 210[0,0,1], . . . , 210[0,0,F−1] in row 0 and column 0 of each layer of memory cell array 202 in pillar 550 (shown in FIG. 5B) is coupled to the corresponding global bit line GBL[0] in column 0 by the corresponding local bit line BL[0,0].

In some embodiments, by including select gate array 206, select transistors 214 and select lines SG* in memory circuit 500, one row of select transistors 214 in memory circuit 500 is enabled for a duration of time, and other rows of select transistors 214 in the same column are disabled for the same duration of time thereby reducing the local source line SL loading of the disabled select transistors 214 compared to other approaches. In some embodiments, by reducing the local SL loading, the total SL loading and capacitance of memory circuit 500 is reduced thereby causing the pre-charge and sensing speed of memory circuit 500 to improve compared to other approaches.

Figure 6A:
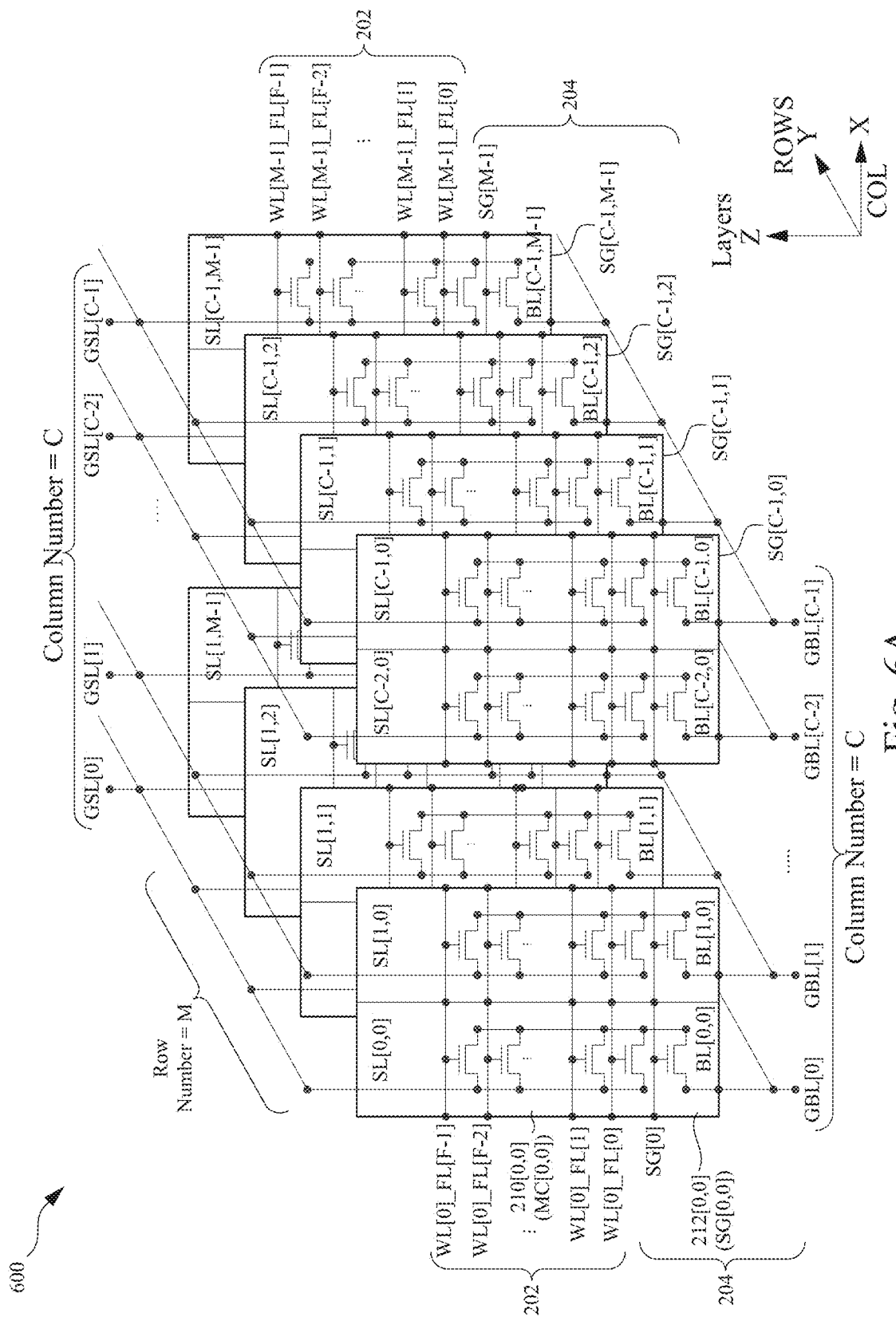
FIG. 6A is a circuit diagram of a memory circuit, in accordance with some embodiments.
Figure 6B:
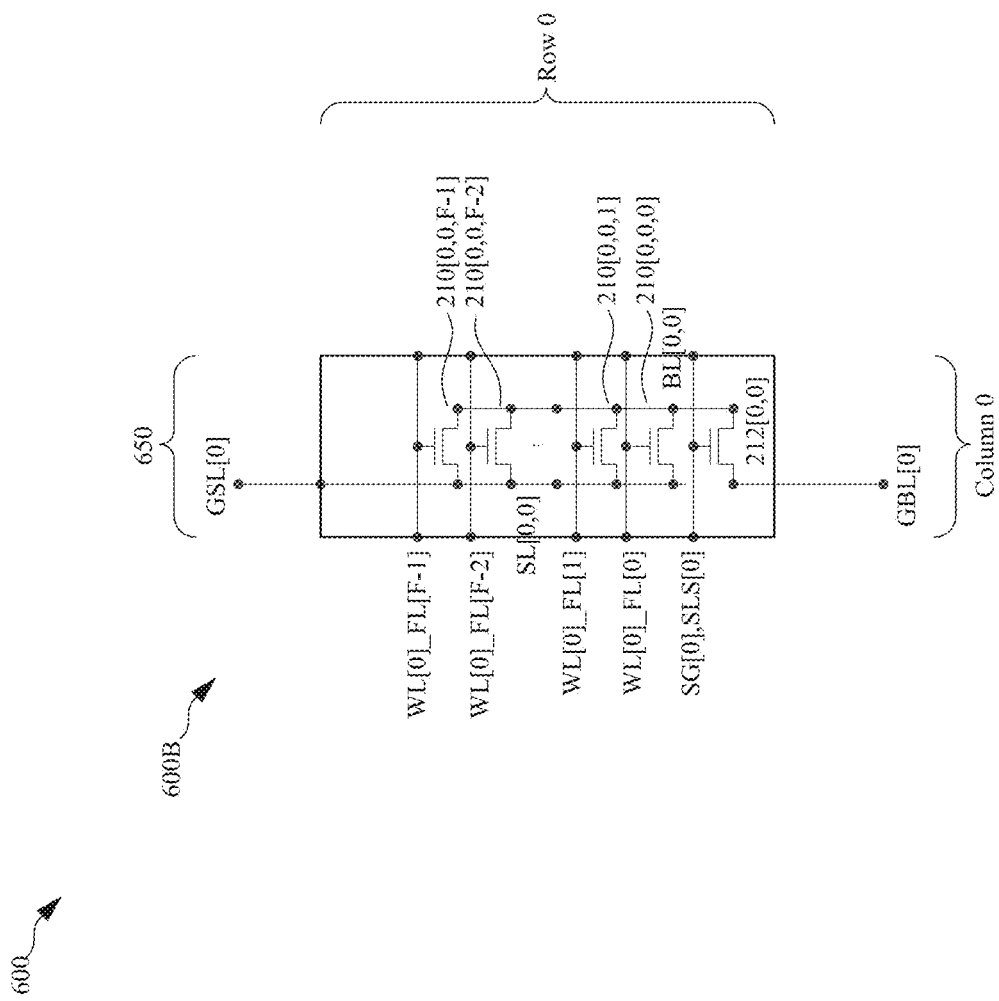
FIG. 6B is a corresponding circuit diagram of a corresponding portion of the memory circuit of FIG. 6A, simplified for ease of illustration.

FIG. 6A is a circuit diagram of a memory circuit 600, in accordance with some embodiments. FIG. 6B is a corresponding circuit diagram of a corresponding portion 600B of memory circuit 600, simplified for ease of illustration. Portion 600B includes one or more features of memory circuit 600 of FIG. 6A for column 0 and row 0 of memory circuit 600, and similar detailed description is omitted. Portion 600B corresponds to a pillar 650.

Memory circuit 600 is a variation of memory circuit 200 of FIGS. 2A-2C. For example, memory circuit 600 corresponds to memory circuit 200 without select gate array 206.

Memory circuit 600 is an embodiment of memory circuit 100 of FIG. 1 expressed in a schematic diagram, and similar detailed description is therefore omitted.

Memory circuit 600 is a variation of memory circuit 200 of FIGS. 2A-2C. In comparison with memory circuit 200 of FIGS. 2A-2C, memory circuit 600 does not include select gate array 206, select transistors 214 and select lines SG*.

By not including select gate array 206, select transistors 214 and select lines SG*, each column of global source lines GSL is directly coupled to columns of local source lines SL. For example, global source line GSL[0] within column 0 is directly coupled to each of local source lines SL[0,0], SL[0,1], . . . , SL[0,M-1] within column 0 of memory circuit 600.

By not including select gate array 206, select transistors 214 and select lines SG*, each source line SL within a corresponding column of memory circuit 600 are coupled together. For example, each of local source lines SL[0,0], SL[0,1], . . . , SL[0,M-1] within column 0 of memory circuit 600 are coupled to each other by global source line GSL[0].

Within each pillar, the drains of each corresponding memory cell on each layer of memory cell array 202 within the pillar is coupled to the corresponding global source line GSL by the corresponding local source line SL. For example, the drains of corresponding memory cells 210[0,0,0], 210[0,0,1], . . . , 210[0,0,F-1] in row 0 and column 0 of each layer of memory cell array 202 in pillar 650 (shown in FIG. 6B) is coupled to the corresponding global source line GSL[0] in column 0 by the corresponding local source line SL[0,0].

In some embodiments, by including select gate array 204, select transistors 212 and select lines SG in memory circuit 600, one row of select transistors 212 in memory circuit 600 is enabled for a duration of time, and other rows of select transistors 212 in the same column are disabled for the same duration of time thereby reducing the local bit line BL loading of the disabled select transistors 212 compared to other approaches. In some embodiments, by reducing the local BL loading, the total BL loading and capacitance of memory circuit 600 is reduced thereby causing the precharge and sensing speed of memory circuit 600 to improve compared to other approaches.

Figure 7A:
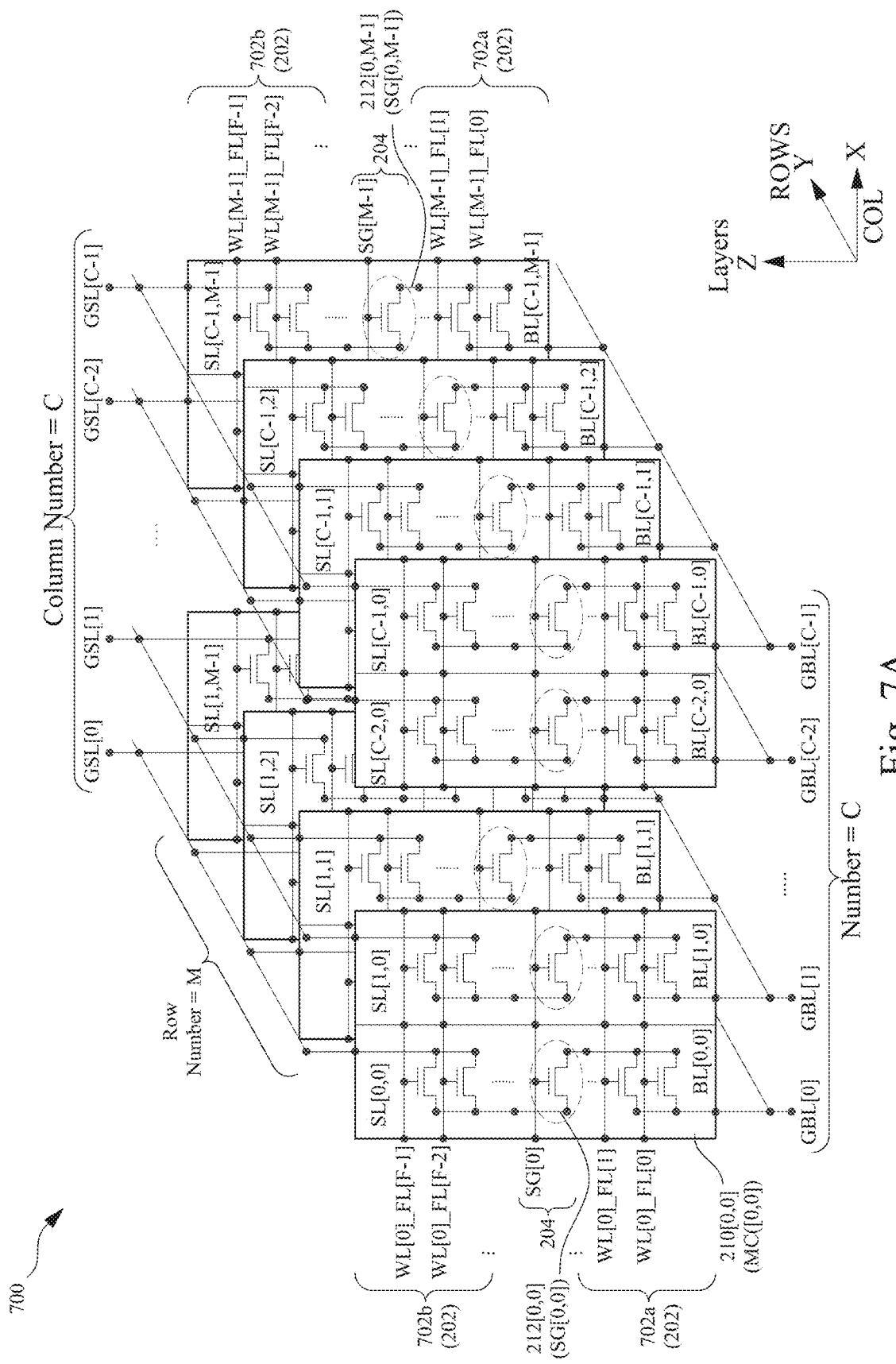
FIG. 7A is a circuit diagram of a memory circuit, in accordance with some embodiments.
Figure 7B:
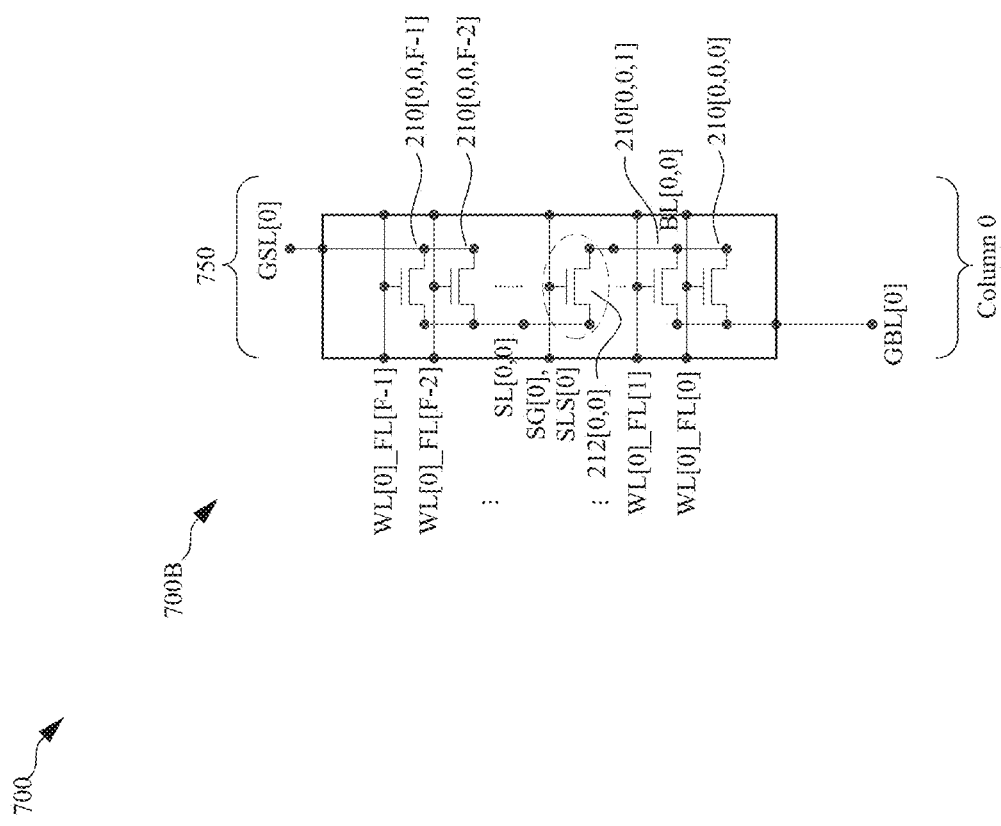
FIG. 7B is a corresponding circuit diagram of a corresponding portions of memory circuit, simplified for ease of illustration.

FIG. 7A is a circuit diagram of a memory circuit 700, in accordance with some embodiments. FIG. 7B is a corresponding circuit diagram of a corresponding portion 700B of memory circuit 700, simplified for ease of illustration. Portion 700B includes one or more features of memory circuit 700 of FIG. 7A for column 0 and row 0 of memory circuit 700, and similar detailed description is omitted. Portion 700B corresponds to a pillar 750.

Memory circuit 700 is a variation of memory circuit 200 of FIGS. 2A-2C. For example, memory circuit 700 corresponds to memory circuit 200 without select gate array 206, and select gate array 204 is positioned between two previously adjacent layers of memory cell array 202.

Memory circuit 700 is an embodiment of memory circuit 100 of FIG. 1 expressed in a schematic diagram, and similar detailed description is therefore omitted.

Memory circuit 700 is a variation of memory circuit 200 of FIGS. 2A-2C. In comparison with memory circuit 200 of FIGS. 2A-2C, memory circuit 700 does not include select gate array 206, select transistors 214 and select lines SG*, and select gate array 204 is positioned between two layers of memory cell array 202 that were adjacent in FIG. 2A. In some embodiments, two elements are adjacent to each other if they are directly next to each other.

Memory cell array 202 includes F layers (e.g., layers 0, 1, 2, . . . , F-1) of memory cells. In FIGS. 7A-7B, select gate array 204 is positioned between layer 1 and layer 2 of memory cell array 202. Other layer configurations of memory circuit 700 or select gate array 204 are within the scope of the present disclosure. Select gate array 204 can be positioned between other layers of memory cell array 202 and is within the scope of the present disclosure. For example, in some embodiments, select gate array 204 is positioned between layer F-1 and layer F-2 of memory cell array 202.

Memory cell array 202 is subdivided into memory cell array 702a (memory cell array 202[0], 202[1]) positioned below select gate array 204, and memory cell array 702b (memory cell array 202[2], 202[F-1]) positioned above select gate array 204.

By positioning select gate array 204 between layer 1 and layer 2 of memory cell array 202, each column of global bit lines GBL is directly coupled to drain/sources of corresponding transistors 210 (memory cells MC) positioned on layers of memory cell array 202 below select gate array 204 within the column of memory cells. For example, global bit line GBL[0] within column 0 is directly coupled to each drain/source of transistors 210[0,0,0] and 210[0,0,1] within column 0 of memory cell array 202.

By positioning select gate array 204 between layer 1 and layer 2 of memory cell array 202, each column of local bit lines BL is directly coupled to source/drains of corresponding transistors 210 (memory cells MC) positioned on layers of memory cell array 202 below select gate array 204 within the column of memory cells. For example, local bit line BL[0] within column 0 is directly coupled to each source/drain of transistors 210[0,0,0] and 210[0,0,1] within column 0 of memory cell array 202.

Within each pillar, the source/drain of each corresponding select transistor 212 is coupled to source/drains of each corresponding memory cell positioned on layers of memory cell array 202 below select transistor 212 by the corresponding local bit line BL. For example, as shown in FIG. 7B, in row 0 and column 0, the source/drain of corresponding select transistor 212[0,0] positioned above layers 0 and 1 of memory cell array 202 is coupled to the source/drains of memory cells 210[0,0,0] and 210[0,0,1] of corresponding layers 0 and 1 of memory cell array 202 in pillar 750 (shown in FIG. 7B) by local bit line BL[0,0].

By positioning select gate array 204 between layer 1 and layer 2 of memory cell array 202, each select transistor 212 of SG array 204 electrically couples the corresponding local bit line BL and the corresponding local source line SL together. For example, select transistor 212[0,0] of row 0 and column 0 of memory circuit 700 electrically couples local bit line BL[0] and local source line SL[0] together.

By positioning select gate array 204 between layer 1 and layer 2 of memory cell array 202, each column of global source lines GSL is directly coupled to source/drains of corresponding transistors 210 (memory cells MC) positioned on layers of memory cell array 202 above select gate array 204 within the column of memory cells. For example, as shown in FIG. 7B, global source line GSL[0] within column 0 is directly coupled to each source/drain of transistors 210[0,0,F-2] and 210[0,0,F-1] within column 0 of memory cell array 202.

By positioning select gate array 204 between layer 1 and layer 2 of memory cell array 202, each column of local source lines SL is directly coupled to drain/sources of corresponding transistors 210 (memory cells MC) positioned on layers of memory cell array 202 above select gate array 204 within the column of memory cells. For example, as shown in FIG. 7B, local source line SL[0] within column 0 is directly coupled to each drain/source of transistors 210[0,0,F–2] and 210[0,0,F–1] within column 0 of memory cell array 202.

Within each pillar, the drain/source of each corresponding select transistor 212 is coupled to drain/sources of each corresponding memory cell positioned on layers of memory cell array 202 above select transistor 212 by the corresponding local source line SL. For example, as shown in FIG. 7B, in row 0 and column 0, the drain/source of corresponding select transistor 212[0,0] positioned below layers F–2 and F–1 of memory cell array 202 is coupled to the drain/sources of memory cells 210[0,0,F–2] and 210[0,0,F–1] of corresponding layers F–2 and F–1 of memory cell array 202 in pillar 750 (shown in FIG. 7B) by local source line SL[0,0].

By including select gate array 204 in memory circuit 700, memory circuit 700 can reduce the local bit line BL/local source line SL loading of disabled select transistors resulting in the benefits discussed above with respect to memory circuit 200.

Figure 8:
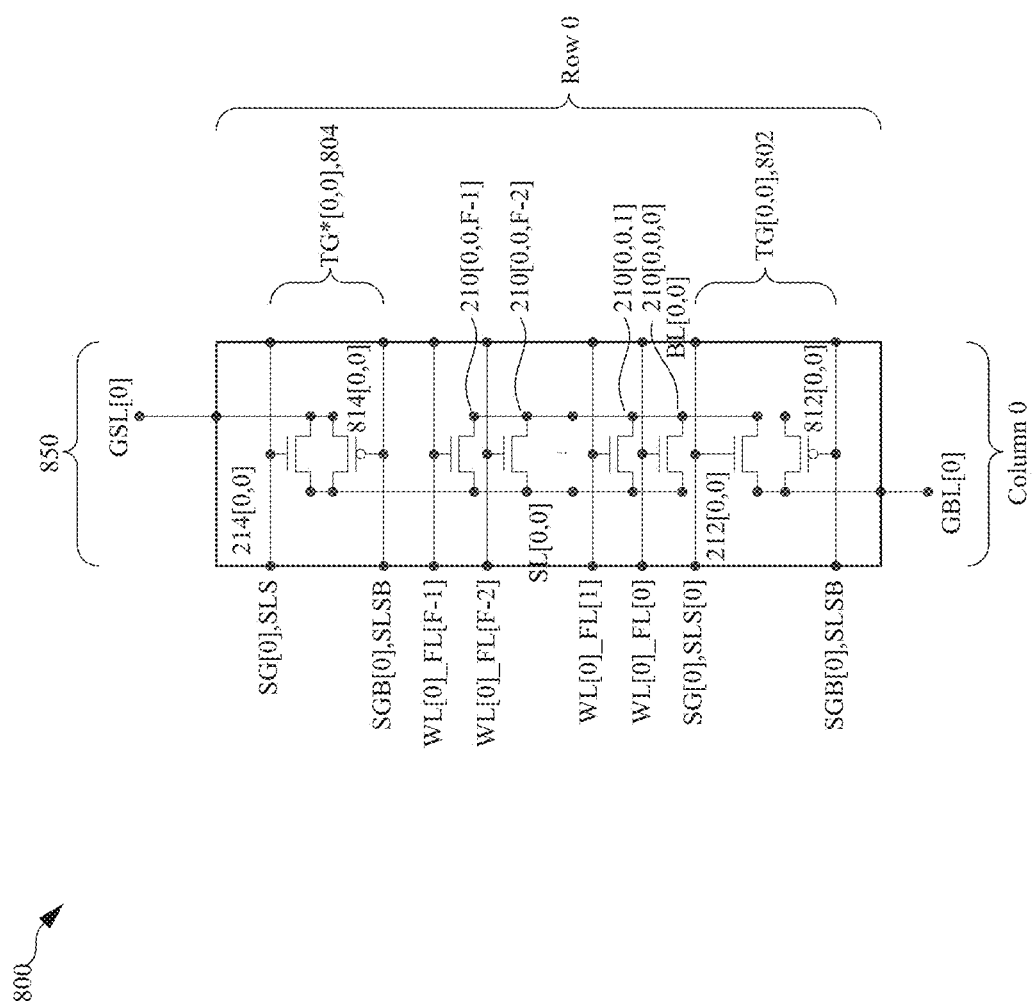
FIG. 8 is a diagram of a memory cell device, in accordance with some embodiments.

FIG. 8 is a diagram of a memory circuit 800, in accordance with some embodiments.

Memory circuit 800 is a variation of memory circuit 200 of FIGS. 2A-2C. For example, select gate arrays SG[0,0] and SG*[0,0] of FIG. 2B have been replaced with corresponding transmission gates TG[0,0] and TG*[0,0] in FIG. 8.

Memory circuit 800 corresponds to an embodiment of pillar 250 of memory circuit 200, and similar detailed description is omitted. Memory circuit 800 includes pillar 850, simplified for ease of illustration. Pillar 850 is a variation of pillar 250 of FIGS. 2B-2C. While FIG. 8 shows a single pillar of memory circuit 800, the features of memory circuit 800 are applicable to each pillar in memory circuit 100-700, and are not shown for brevity. For example, transmission gate TG[0,0] replaces each select gate in select gate array 104 or 204, and transmission gate TG*[0,0] replaces each select gate in select gate array 106 or 206, and similar detailed description is omitted. In other words, transmission gate TG[0,0] is part of a first transmission gate array 802 that replaces select gate array 104 or 204, and transmission gate TG*[0,0] is part of a second transmission gate array 804 that replaces select gate array 106 or 206, and similar detailed description is omitted. Each transmission gate of the first transmission gate array 802 is configured to selectively couple the corresponding global bit line and the corresponding column of local bit lines together. Each transmission gate of the second transmission gate array 804 is configured to selectively couple the corresponding global source line and the corresponding column of local source lines together.

Pillar 850 includes one or more features of memory circuit 200 of FIG. 2A for column 0 and row 0 of memory circuit 200, and similar detailed description is omitted.

Transmission gate TG[0,0] includes select transistor 212[0,0] and a select transistor 812[0,0]. Select transistor 812[0,0] is similar to select transistor 212[0,0], and similar detailed description is omitted.

Each transmission gate TG[0,0], TG[1, 0], . . . , TG[C–1, 0], . . . , TG[0, M–1], SG[1, M–1], . . . , TG[C–1, M–1] of first transmission gate array 802 includes a corresponding select transistor 212[0,0], 212[1, 0], . . . , 212[C–1, 0], . . . , 212[0, M–1], 212[1, M–1], . . . , 212[C–1, M–1] and a corresponding select transistor 812[0,0], 812[1, 0], . . . , 812[C–1, 0], . . . , 812[0, M–1], 212[1, M–1], . . . , 812[C–1, M–1] (collectively referred to as "select transistors 812"). Select transistors 812 herein are denoted by 812[column number, row number]. For ease of illustration, memory circuit 800 includes one column of select transistors 812.

Each column of select transistors 212 and 812 is configured to selectively couple the corresponding global bit line and the corresponding column of local bit lines together. Column 0 of select transistors 212[0,0] 212[0,1], . . . , 212[0,M–1] and select transistors 812[0,0] 812[0,1], . . . , 812[0,M–1] (not shown) are configured to selectively couple the corresponding global bit line GBL[0] and the corresponding column of local bit lines BL[0,0], BL[0,1], . . . , BL[0,M–1].

Each of select transistors 812 are p-type transistors. In some embodiments, each of select transistors 812 are PMOS transistors. Other transistor types are within the scope of the present disclosure. In some embodiments, each of select transistors 812 are n-type transistors. In some embodiments, each of select transistors 812 are NMOS transistors.

Each select transistor 812 includes a gate coupled to a corresponding select line SGB, a drain/source coupled to at least a corresponding global bit line GBL and a corresponding drain/source of select transistor 212, and a source/drain coupled to at least a corresponding bit line BL and a corresponding source/drain of select transistor 212.

In pillar 850, the source/drain of corresponding select transistor 212[0,0] and the source/drain of corresponding select transistor 812[0,0] in row 0 and column 0 are coupled together, and are further coupled to the drains of memory cells 210[0,0,0], 210[0,0,1], . . . , 210[0,0,F–1] in row 0 and column 0 of each layer of memory cell array 202 in pillar 250 by local bit line BL[0,0].

In pillar 850, the drain/source of corresponding select transistor 212[0,0] and the drain/source of corresponding select transistor 812[0,0] in row 0 and column 0 are coupled together, and are further coupled to the global bit line GBL[0].

Each gate of a corresponding row of select transistors 812 is electrically coupled to a corresponding select line SGB[0], SGB[1], . . . , SGB[M–1] (collectively referred to as "select lines SGB"), and is configured to receive a corresponding select line signal SLSB[0], SLSB[1], . . . , SLSB[M–1] (collectively referred to as "select line signal SLSB")). Each select transistor of select transistors 812 is enabled or disabled in response to the corresponding select line signal SLSB[0], SLSB[1], . . . , SLSB[M–1] received on the corresponding select line SGB[0], SGB[1], . . . , SGB[M–1]. In some embodiments, select line signals SLSB are inverted from select line signals SLS and vice versa.

If enabled, select transistors 212[0,0] and 812[0,0] electrically couple the corresponding global bit line and the corresponding column of local bit lines. If disabled, select transistors 212[0,0] and 812[0,0] electrically decouple the corresponding global bit line and the corresponding column of local bit lines. In some embodiments, one row of select transistors 212 and 812 are enabled for a duration of time (between time T1-T2 in FIG. 3C), and the other rows of select transistors 212 and 812 are disabled for the same duration of time (between time T1-T2 in FIG. 3C).

Transmission gate TG*[0,0] includes select transistor 214[0,0] and a select transistor 814[0,0]. Select transistor 814[0,0] is similar to select transistor 214[0,0], and similar detailed description is omitted.

Each transmission gate TG*[0,0], TG*[1, 0], ..., TG*[C−1, 0], ..., TG*[0, M−1], SG[1, M−1], ..., TG*[C−1, M−1] of second transmission gate array 804 includes a corresponding select transistor 214[0,0], 214[1, 0], ..., 214[C−1, 0], ..., 214[0, M−1], 214[1, M−1], ..., 214[C−1, M−1] and a corresponding select transistor 814[0,0], 814[1, 0], ..., 814[C−1, 0], ..., 814[0, M−1], 214[1, M−1], ..., 814[C−1, M−1] (collectively referred to as "select transistors 814"). Select transistors 814 herein are denoted by 814[column number, row number]. For ease of illustration, memory circuit 800 includes one column of select transistors 814.

Each column of select transistors 214 and 814 is configured to selectively couple the corresponding global source line and the corresponding column of local source lines together. Column 0 of select transistors 214[0,0] 214[0,1], ..., 214[0,M−1] and select transistors 814[0,0] 814[0,1], ..., 814[0,M−1] (not shown) are configured to selectively couple the corresponding global source line GSL[0] and the corresponding column of local source lines SL[0,0], SL[0,1], ..., SL[0,M−1].

Each of select transistors 814 are p-type transistors. In some embodiments, each of select transistors 814 are PMOS transistors. Other transistor types are within the scope of the present disclosure. In some embodiments, each of select transistors 814 are n-type transistors. In some embodiments, each of select transistors 814 are NMOS transistors.

Each select transistor 814 includes a gate coupled to a corresponding select line SGB, a drain/source coupled to at least a corresponding global source line GSL and a corresponding drain/source of select transistor 214, and a source/drain coupled to at least a corresponding source line SL and a corresponding source/drain of select transistor 214.

In pillar 850, the source/drain of corresponding select transistor 214[0,0] and the source/drain of corresponding select transistor 814[0,0] in row 0 and column 0 are coupled together, and are further coupled to the sources of memory cells 210[0,0,0], 210[0,0,1], ..., 210[0,0,F−1] in row 0 and column 0 of each layer of memory cell array 202 in pillar 250 by local source line SL[0,0].

In pillar 850, the drain/source of corresponding select transistor 214[0,0] and the drain/source of corresponding select transistor 814[0,0] in row 0 and column 0 are coupled together, and are further coupled to the global source line GSL[0].

Each gate of a corresponding row of select transistors 814 is electrically coupled to a corresponding select line SGB[0], SGB[1], ..., SGB[M−1] of select lines SGB, and is configured to receive a corresponding select line signal SLSB[0], SLSB[1], ..., SLSB[M−1] of select line signals SLSB. Each select transistor of select transistors 814 is enabled or disabled in response to the corresponding select line signal SLSB[0], SLSB[1], ..., SLSB[M−1] received on the corresponding select line SGB[0], SGB[1], ..., SGB[M−1]. In some embodiments, select line signals SLSB received by transmission gates 814 is different from the select line signals received by transmission gates 812.

If enabled, select transistors 214[0,0] and 814[0,0] electrically couple the corresponding global source line and the corresponding column of local source lines. If disabled, select transistors 214[0,0] and 814[0,0] electrically decouple the corresponding global source line and the corresponding column of local source lines. In some embodiments, one row of select transistors 214 and 814 are enabled for a duration of time (between time T1-T2 in FIG. 3C), and the other rows of select transistors 214 and 814 are disabled for the same duration of time (between time T1-T2 in FIG. 3C).

Figure 9:
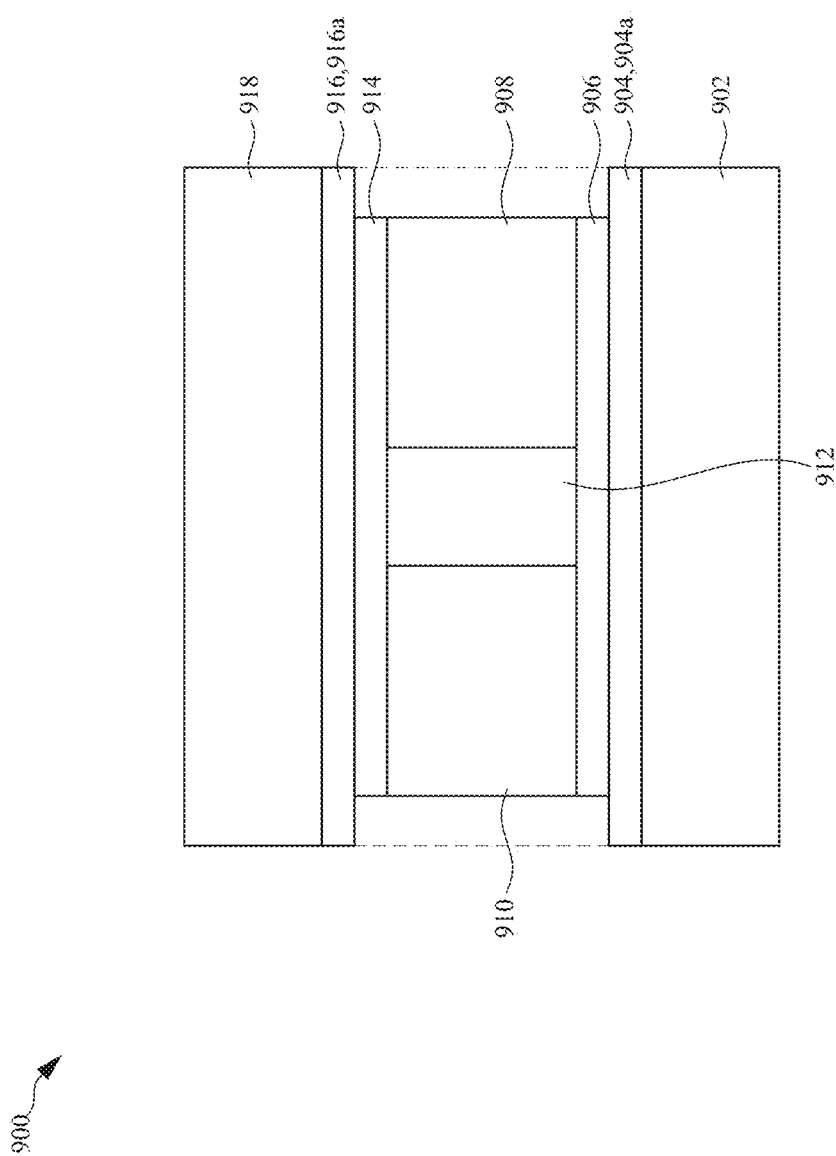
FIG. 9 is a diagram of a memory cell device, in accordance with some embodiments.

FIG. 9 is a diagram of a memory cell device 900, in accordance with some embodiments. Memory cell device 900 is usable as part or all of one or more memory cells of memory cell array 102 or 202, discussed above with respect to FIG. 1 or 2A-2C.

In some embodiments, memory cell device is a dual-gate (DG) thin film transistor (TFT). Other transistor types are within the scope of the present disclosure.

In some embodiments, memory cell device 900 is useable as memory cell MC[0,0,0] in a layer 0 of memory cell array 202 and memory cell MC[0,0,1] in a layer 1 of memory cell array 202. In some embodiments, memory cell device 900 has a first gate (e.g., gate layer 902) that corresponds to the gate of transistor 210[0,0,0] in layer 0 of memory cell array 202, and a second gate (e.g., gate layer 918) that corresponds to the gate of transistor 210[0,1,0] in layer 0 of memory cell array 202. Memory cell device 900 can be usable as other memory cells located on adjacent layers of memory cell array 202.

Memory cell device 900 includes a gate layer 902. In some embodiments, gate layer 902 includes a conductive material. In some embodiments, gate layer 902 includes polysilicon, LTPS, a-Si TFT, IGZO or semiconductor material, or combinations thereof, or the like. In some embodiments, gate layer 902 corresponds to word line WL. In some embodiments, word line WL includes polysilicon, LTPS, a-Si TFT, IGZO or semiconductor material, or combinations thereof, or the like.

Memory cell device 900 further includes an insulating layer 904 over the gate layer 902 and a gate layer 918 over an insulating layer 916. In some embodiments, insulating layer 904 includes a ferroelectric base layer 904a and insulating layer 916 includes a ferroelectric base layer 916a. In some embodiments, at least insulating layer 904 or 916 includes SiO, $SiO_2$ high-k oxide or combinations thereof, or the like. In some embodiments, at least insulating layer 904 or 916 includes a gate oxide or the like.

The ferroelectric base layer 904a is below a channel layer 906. The ferroelectric base layer 916a is above the channel layer 914. In some embodiments, at least ferroelectric base layer 904a or 916a includes perovskite, SBT, PZT, HfZrO, HfO or combinations thereof, or the like. In some embodiments, at least ferroelectric base layer 904a or 916a is a layer with ferroelectric characteristics. In some embodiments, at least insulating layer 904 or 916 is a charge-trapping base layer with charge-trapping characteristics.

Memory cell device 900 further includes a source 908 and a drain 910 on channel layer 906/ferroelectric base layer 904a. The source 908 and drain 910 are below channel layer 914/ferroelectric base layer 916a. In some embodiments, at least source 908 or drain 910 includes a conductive material. In some embodiments, a conductive material includes doped polysilicon, TiN, W, Cu, Co, Ru, or combinations thereof, or the like.

In some embodiments, source 908 corresponds to the source of transistor 210[0,0,0] in layer 0 of memory cell array 202, and the source of transistor 210[0,1,0] in layer 0 of memory cell array 202. In some embodiments, drain 910 corresponds to the drain of transistor 210[0,0,0] in layer 0 of memory cell array 202, and the drain of transistor 210[0,1,0] in layer 0 of memory cell array 202. In some embodiments, bit line BL is coupled to the drain 910, and source line SL is coupled to the source 908. In some embodiments, bit line BL or source line SL includes doped polysilicon, TiN, W, Cu, Co, Ru, or combinations thereof, or the like.

Memory cell device 900 further includes a channel 906 and a channel 914. In some embodiments, at least channel 906 or 914 extends between the source 908 and drain 910. In some embodiments, at least channel 906 or 914 includes a conductive material. In some embodiments, at least channel 906 or 914 includes polysilicon, LTPS, a-Si TFT, IGZO or semiconductor material, or combinations thereof, or the like. In some embodiments, insulating layer 904 is on gate layer 902, channel 906 is on insulating layer 904, source 908 and drain 910 are on channel 906, channel 914 is on source 908 and drain 910, insulating layer 916 is on channel 914, and gate layer 918 is on insulating layer 916.

Memory cell device 900 further includes an insulating layer 912 between source 908 and drain 910. In some embodiments, memory cell device 900 is a 2-bit memory cell with common source and drain. In some embodiments, insulating layer 912 includes SiO, $SiO_2$ or combinations thereof, or the like.

In some embodiments, gate layer 918 is over the insulating layer 916. In some embodiments, gate layer 918 includes a conductive material. In some embodiments, gate layer 918 includes polysilicon, LTPS, a-Si TFT, IGZO or semiconductor material, or combinations thereof, or the like. In some embodiments, gate layer 918 corresponds to word line WL. In some embodiments, one or more layers of memory cell device 900 are not included. In some embodiments, one or more layers of memory cell device 900 are divided into multiple layers.

By being included in memory circuit 100-800 discussed above with respect to FIGS. 1-8, memory cell device 900 operates to achieve the benefits discussed above with respect to memory circuit 100-800.

Method

Figure 10:
FIG. 10 is a flowchart of a method of operating a circuit, in accordance with some embodiments.

FIG. 10 is a flowchart of a method of operating a circuit, in accordance with some embodiments.

In some embodiments, FIG. 10 is a flowchart of a method of operating the memory circuit of FIGS. 1-9. It is understood that additional operations may be performed before, during, and/or after the method 1000 depicted in FIG. 10, and that some other operations may only be briefly described herein. It is understood that method 1000 utilizes features of one or more of circuits 100, 200, 300A, 400, 500, 600, 700, 800 or memory cell device 900, or timing diagram 300B of FIG. 3B.

In operation 1002 of method 1000, a first row of select transistors is enabled. In some embodiments, operation 1002 includes at least receiving, by a first selection transistor in the first row of select transistors, a first select line signal, and turning on the first selection transistor in response to the first select line signal thereby electrically coupling a first local bit line and a global bit line to each other.

In some embodiments, the first row of select transistors of method 1000 includes row 0. In some embodiments, the first selection transistor of method 1000 includes selection transistor 212[0,0]. In some embodiments, the first select line signal of method 1000 includes select line signal SLS[0]. In some embodiments, the first local bit line of method 1000 includes bit line BL[0,0]. In some embodiments, the global bit line of method 1000 includes global bit line BL[0].

In operation 1004 of method 1000, a second row of select transistors is enabled. In some embodiments, operation 1004 includes at least receiving, by a second selection transistor in the second row of select transistors, a second select line signal, and turning on the second selection transistor in response to the second select line signal thereby electrically coupling a first local source line and a global source line to each other.

In some embodiments, the second row of select transistors of method 1000 includes the row of selection transistors 214 in row 0. In some embodiments, the second selection transistor of method 1000 includes selection transistor 214[0,0]. In some embodiments, the second select line signal of method 1000 includes select line signal SLS*[0]. In some embodiments, the first local source line of method 1000 includes source line SL[0,0]. In some embodiments, the global source line of method 1000 includes global source line SL[0].

In operation 1006 of method 1000, a third row of select transistors is disabled. In some embodiments, operation 1006 includes at least receiving, by a third selection transistor in the third row of select transistors, a third select line signal, and turning off the third selection transistor in response to the third select line signal thereby electrically decoupling a second local bit line and the global bit line from each other.

In some embodiments, the third row of select transistors of method 1000 includes row 1. In some embodiments, the third selection transistor of method 1000 includes selection transistor 212[0,1]. In some embodiments, the third select line signal of method 1000 includes select line signal SLS[1]. In some embodiments, the second local bit line of method 1000 includes bit line BL[0,1].

In operation 1008 of method 1000, a fourth row of select transistors is disabled. In some embodiments, operation 1008 includes at least receiving, by a fourth selection transistor in the fourth row of select transistors, a fourth select line signal, and turning off the fourth selection transistor in response to the fourth select line signal thereby electrically decoupling a second local source line and the global source line from each other.

In some embodiments, the fourth row of select transistors of method 1000 includes the row of selection transistors 214 in row 1. In some embodiments, the fourth selection transistor of method 1000 includes selection transistor 214[0,1]. In some embodiments, the fourth select line signal of method 1000 includes select line signal SLS*[1]. In some embodiments, the second local source line of method 1000 includes source line SL[0,1].

In operation 1010 of method 1000, a first row of memory cells is enabled in response to a first word line signal. In some embodiments, operation 1010 includes at least receiving, by a first memory cell in the first row of memory cells, the first word line signal, and turning on the first memory cell in response to the first word line signal.

In some embodiments, the first row of memory cells of method 1000 includes memory cells in row 0. In some embodiments, the first memory cell of method 1000 includes memory cell 210[0,0,0]. In some embodiments, the first word line signal of method 1000 includes word line signal WL[0]_FL[0].

In operation 1012 of method 1000, a second row of memory cells is disabled in response to a second word line signal. In some embodiments, operation 1012 includes at least receiving, by a second memory cell in the second row of memory cells, the second word line signal, and turning off the second memory cell in response to the second word line signal.

In some embodiments, the second row of memory cells of method 1000 includes memory cells in row 1. In some embodiments, the second memory cell of method 1000 includes memory cell 210[0,1,0]. In some embodiments, the second word line signal of method 1000 includes word line signal WL[1]_FL[0].

In operation 1014 of method 1000, the first row of select transistors is disabled. In some embodiments, operation 1014 includes turning off the first selection transistor in response to the first select line signal thereby electrically decoupling the first local bit line and the global bit line from each other.

In operation 1016 of method 1000, the second row of select transistors is disabled. In some embodiments, operation 1016 includes turning off the second selection transistor in response to the second select line signal thereby electrically decoupling the first local source line and the global source line from each other.

In operation 1018 of method 1000, the first row of memory cells is disabled in response to the first word line signal.

By operating method 1000, the memory circuit operates to achieve the benefits discussed above with respect to memory circuit 100-800 and memory cell device 900. While method 1000 was described above with reference to FIGS. 1, 2A-2C and 3A-3B, it is understood that method 1000 utilizes the features of one or more of FIGS. 4-7B 8 and 9.

While method 1000 was described above with reference to rows 0-1, column 0 and layers 0 and 1 of memory cell array 202, it is understood that method 1000 applies to each row, each column and each layer of memory cell array 202.

In some embodiments, one or more of the operations of method 1000 is not performed. Furthermore, various PMOS or NMOS transistors shown in FIGS. 2A-9 are of a particular dopant type (e.g., N-type or P-type) are for illustration purposes. Embodiments of the disclosure are not limited to a particular transistor type, and one or more of the PMOS or NMOS transistors shown in FIGS. 2A-9 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of transistors in FIG. 2A-10 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. In some embodiments, the memory circuit includes a first memory cell on a first layer, a second memory cell on a second layer different from the first layer, a first select transistor on a third layer different from the first layer and the second layer, a first bit line extending in a first direction, and being coupled to the first memory cell and the second memory cell, and a first source line extending in the first direction, being coupled to the first memory cell, the second memory cell and the first select transistor, and being separated from the first bit line in a second direction different from the first direction. In some embodiments, the memory circuit further includes a second source line extending in the first direction, and being coupled to the first select transistor.

Another aspect of this description relates to a memory circuit. In some embodiments, the memory circuit includes a first memory cell array on a first layer, a second memory cell array on a second layer different from the first layer, a first select transistor array on a third layer different from the first layer and the second layer, a first set of bit lines extending in a first direction, being coupled to the first memory cell array, the second memory cell array and the first select transistor array, a second set of bit lines extending in the first direction, and being coupled to the first memory cell array and the second memory cell array by the first select transistor array, and a first set of source lines extending in the first direction, being coupled to the first memory cell array and the second memory cell array, and being separated from the first set of bit lines in a second direction different from the first direction.

Still another aspect of this description relates to a memory circuit. In some embodiments, the memory circuit includes a first memory cell on a first layer, a second memory cell on a second layer different from the first layer, a third memory cell on a third layer different from the first layer and the second layer, a first transmission gate on a fourth layer different from the first layer, the second layer and the third layer, a second transmission gate on a fifth layer different from the first layer, the second layer, the third layer and the fourth layer, a bit line extending in a first direction, and being coupled to the first memory cell, the second memory cell, the third memory cell and the first transmission gate, a global bit line extending in the first direction, and being coupled to the first transmission gate, a source line extending in the first direction, being coupled to the first memory cell, the second memory cell and the third memory cell, and being separated from the bit line in a second direction different from the first direction, and a global source line extending in the first direction, and being coupled to the second transmission gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
   a first memory cell on a first layer;
   a second memory cell on a second layer different from the first layer;
   a first select transistor on a third layer different from the first layer and the second layer;
   a first bit line extending in a first direction, and being coupled to the first memory cell and the second memory cell;
   a first source line extending in the first direction, being coupled to the first memory cell, the second memory cell and the first select transistor, and being separated from the first bit line in a second direction different from the first direction; and
   a second source line extending in the first direction, and being coupled to the first select transistor.

2. The memory circuit of claim 1, further comprising:
   a first select line extending in the second direction, and being coupled to the first select transistor;

a first word line extending in the second direction, being separated from the first select line in the first direction, and being coupled to the first memory cell; and a second word line extending in the second direction, being separated from the first word line in the first direction, and being coupled to the second memory cell.

3. The memory circuit of claim 2, wherein the first select transistor comprises:

a first gate, a first drain and a first source, the first gate being coupled to the first select line, the first drain being coupled to the first source line, and the first source being coupled to the second source line.

4. The memory circuit of claim 3, wherein the first memory cell comprises:

a first transistor having a second gate, a second drain and a second source, the second gate being coupled to the first word line, the second drain being coupled to the first drain by the first source line, and the second source being coupled to the first bit line.

5. The memory circuit of claim 4, wherein the second memory cell comprises:

a second transistor having a third gate, a third drain and a third source, the third gate being coupled to the second word line, the third drain being coupled to the first drain and the second drain by the first source line, and the third source being coupled to the second source by the first bit line.

6. The memory circuit of claim 1, further comprising:

a third memory cell on the first layer, and being separated from the first memory cell in a third direction different from the first direction and the second direction; and a fourth memory cell on the second layer, and being separated from the second memory cell in the third direction.

7. The memory circuit of claim 6, further comprising:

a second select transistor on the third layer, being separated from the first select transistor in the third direction, and being coupled to the third memory cell and the fourth memory cell.

8. The memory circuit of claim 7, further comprising:

a second bit line extending in the first direction, being coupled to the third memory cell, the fourth memory cell and the second select transistor, and being separated from the first bit line in the third direction.

9. The memory circuit of claim 8, further comprising:

a third source line extending in the first direction, being coupled to the third memory cell, the fourth memory cell and the second select transistor, and being separated from the first source line in the third direction.

10. A memory circuit, comprising:

a first memory cell array on a first layer;

a second memory cell array on a second layer different from the first layer;

a first select transistor array on a third layer different from the first layer and the second layer;

a first set of bit lines extending in a first direction, being coupled to the first memory cell array, the second memory cell array and the first select transistor array;

a second set of bit lines extending in the first direction, and being coupled to the first memory cell array and the second memory cell array by the first select transistor array; and a first set of source lines extending in the first direction, being coupled to the first memory cell array and the second memory cell array, and being separated from the first set of bit lines in a second direction different from the first direction.

11. The memory circuit of claim 10, wherein the first select transistor array comprises:

a first select line extending in the second direction; and a first select transistor having a first gate, a first drain and a first source, the first gate being coupled to the first select line, the first drain being coupled to a first bit line of the first set of bit lines, and the first source being coupled to a first bit line of the second set of bit lines.

12. The memory circuit of claim 11, wherein the first memory cell array comprises:

a first word line extending in the second direction, and being separated from the first select line in the first direction; and a first n-type transistor having a second gate, a second drain and a second source, the second gate being coupled to the first word line, the second drain being coupled to the first drain by the first bit line of the first set of bit lines, and the second source being coupled to a first source line of the first set of source lines.

13. The memory circuit of claim 12, wherein the second memory cell array comprises:

a second word line extending in the second direction, and being separated from the first word line in the first direction; and a second n-type transistor having a third gate, a third drain and a third source, the third gate being coupled to the second word line, the third drain being coupled to the first drain and the second drain by the first bit line of the first set of bit lines, and the third source being coupled to the second source by the first source line of the first set of source lines.

14. The memory circuit of claim 13, further comprising:

a first select line driver coupled to the first select line.

15. The memory circuit of claim 10, further comprising:

a first word line extending in the second direction, and being coupled to a first row of memory cells in the first memory cell array;

a second word line extending in the second direction, and being coupled to a second row of memory cells in the first memory cell array;

a third word line extending in the second direction, and being coupled to a third row of memory cells in the second memory cell array; and a fourth word line extending in the second direction, and being coupled to a fourth row of memory cells in the second memory cell array.

16. The memory circuit of claim 15, further comprising:

a first word line driver coupled to the first row of memory cells in the first memory cell array and the second row of memory cells in the first memory cell array by the first word line and the second word line; and a second word line driver coupled to the third row of memory cells in the second memory cell array and the fourth row of memory cells in the second memory cell array by the third word line and the fourth word line.

17. The memory circuit of claim 16, further comprising:

a first pre-decoder circuit coupled to the first word line driver; and a second pre-decoder circuit coupled to the second word line driver.

18. A memory circuit, comprising:

a first memory cell on a first layer;

a second memory cell on a second layer different from the first layer;

a third memory cell on a third layer different from the first layer and the second layer;

a first transmission gate on a fourth layer different from the first layer, the second layer and the third layer;

a second transmission gate on a fifth layer different from the first layer, the second layer, the third layer and the fourth layer;

a bit line extending in a first direction, and being coupled to the first memory cell, the second memory cell, the third memory cell and the first transmission gate;

a global bit line extending in the first direction, and being coupled to the first transmission gate;

a source line extending in the first direction, being coupled to the first memory cell, the second memory cell and the third memory cell, and being separated from the bit line in a second direction different from the first direction; and a global source line extending in the first direction, and being coupled to the second transmission gate.

19. The memory circuit of claim 18, wherein the first transmission gate comprises:

a first transistor having a first gate, a first drain and a first source, the first gate being configured to receive a first word line signal, the first drain being coupled to the first memory cell, the second memory cell and the third memory cell by the bit line, and the first source being coupled to the global bit line; and a second transistor having a second gate, a second drain and a second source, the second gate being configured to receive a second word line signal inverted from the first word line signal, the second drain being coupled to the first memory cell, the second memory cell and the third memory cell by the bit line, and the second source being coupled to the global bit line, wherein the first source and the second source are coupled together, and the first drain and the second drain are coupled together.

20. The memory circuit of claim 19, wherein the second transmission gate comprises:

a third transistor having a third gate, a third drain and a third source, the third gate being configured to receive a third word line signal, the third drain being coupled to the first memory cell, the second memory cell and the third memory cell by the source line, and the third source being coupled to the global source line; and a fourth transistor having a fourth gate, a fourth drain and a fourth source, the fourth gate being configured to receive a fourth word line signal inverted from the third word line signal, the fourth drain being coupled to the first memory cell, the second memory cell and the third memory cell by the source line, and the fourth source being coupled to the global source line, wherein the third source and the fourth source are coupled together, and the third drain and the fourth drain are coupled together.

* * * * *